(12) United States Patent
Huang et al.

(10) Patent No.: US 11,150,296 B2
(45) Date of Patent: Oct. 19, 2021

(54) METHOD AND APPARATUS FOR TESTING A SEMICONDUCTOR DEVICE

(71) Applicant: Taiwan Semiconductor Manufacturing Company, Ltd., Hsin-Chu (TW)

(72) Inventors: Szu-Chia Huang, Hsinchu (TW); Jhih Jie Shao, Hsinchu (TW); Tang-Hsuan Chung, Kaohsiung (TW); Huan Chi Tseng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 114 days.

(21) Appl. No.: 16/726,467

(22) Filed: Dec. 24, 2019

(65) Prior Publication Data

US 2020/0132757 A1    Apr. 30, 2020

Related U.S. Application Data

(62) Division of application No. 15/283,943, filed on Oct. 3, 2016, now Pat. No. 10,520,545, which is a division of application No. 13/225,816, filed on Sep. 6, 2011, now Pat. No. 9,459,316.

(51) Int. Cl.
*G01R 31/30* (2006.01)

(52) U.S. Cl.
CPC ......... *G01R 31/30* (2013.01); *G01R 31/3004* (2013.01)

(58) Field of Classification Search
CPC .............................. G01R 31/3004; G01R 31/30
See application file for complete search history.

(56) References Cited

U.S. PATENT DOCUMENTS

| | | |
|---|---|---|
| 3,523,188 A | 8/1970 | Kazan |
| 4,351,031 A | 9/1982 | Flaherty et al. |
| 6,016,281 A | 1/2000 | Brox |
| 8,531,201 B2 | 9/2013 | Shao et al. |
| 9,151,798 B2 | 10/2015 | Shao et al. |
| 9,459,316 B2 * | 10/2016 | Huang ................. G01R 31/30 |
| 10,520,545 B2 * | 12/2019 | Huang ............. G01R 31/3004 |
| 2006/0242498 A1 | 10/2006 | Hamilton et al. |
| 2007/0109700 A1 | 5/2007 | Shimogawa et al. |
| 2011/0041115 A1 | 2/2011 | Potkonjak |

* cited by examiner

*Primary Examiner* — Paresh Patel
(74) *Attorney, Agent, or Firm* — Haynes and Boone, LLP

(57) ABSTRACT

The present disclosure provides methods for testing and evaluating electrical parameters of electronic circuits. An exemplary method includes providing a device-under-test electrically coupled to a testing apparatus; and determining an optimum value of a first electrical parameter and an optimum value of a second parameter by testing the device-under-test according to a set of first electrical parameter values and a set of second electrical parameter values. The optimum value of the first electrical parameter and the optimum value of the second parameter are determined based on an electrical noise response of the device-under-test.

20 Claims, 19 Drawing Sheets

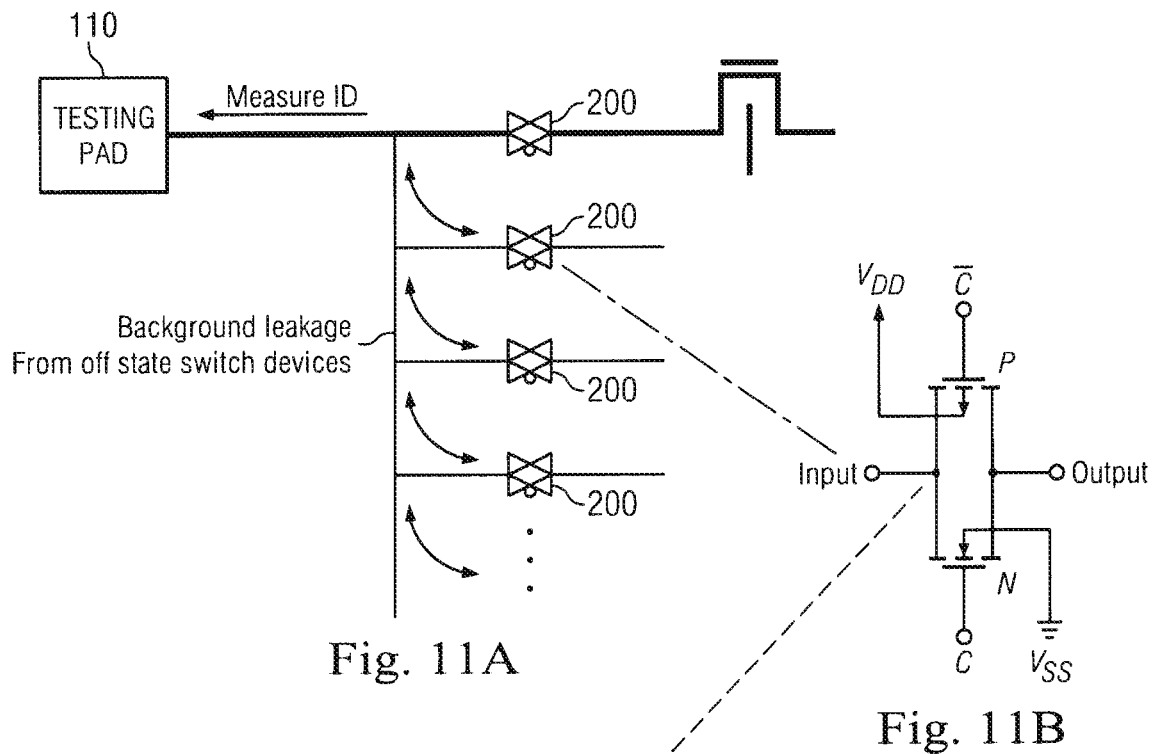
Fig. 11A
Fig. 11B
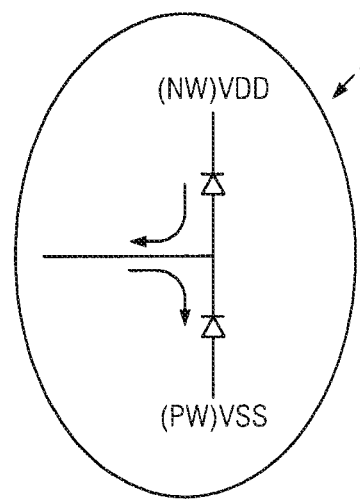
Fig. 11C

METHOD AND APPARATUS FOR TESTING A SEMICONDUCTOR DEVICE

This is a divisional application of U.S. patent application Ser. No. 15/283,943, filed Oct. 3, 2016, now U.S. Pat. No. 10,520,545, which is a divisional application of U.S. patent application Ser. No. 13/225,816, filed Sep. 6, 2011, now U.S. Pat. No. 9,459,316, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be increased while geometry size (i.e., the smallest component (or line) that can be created using a fabrication process) has decreased. This scaling down process generally provides benefits by increasing production efficiency and lowering associated costs.

The fabrication of semiconductor devices may involve one or more testing processes. A plurality of test units and test pads may be used to carry out the testing. For traditional testing methods, the available number of test units is constrained by the available number of test pads. As semiconductor device continue to shrink, available space on a wafer becomes a valuable resource. As a result, the number of test pads on the wafer may be limited (e.g., less than 30) due to chip area consumption concerns, and that in turn limits the number of test units that can be implemented. As IC technologies continue to advance, the limited number of test units and test pads may not be sufficient to allow effective and efficient execution of the testing processes. Furthermore, electrical noise such as parasitical leakage may also adversely affect test measurement accuracy.

Therefore, while existing testing apparatuses and methodologies are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 11A-11C are circuit diagrams illustrating one or more switching devices.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1A:
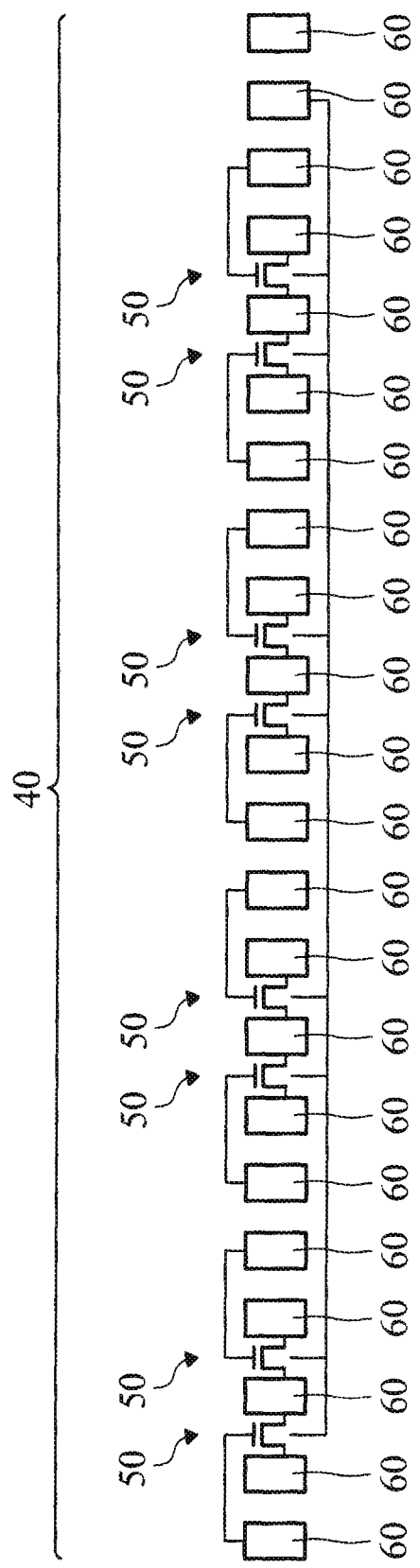
FIGS. 1A-1B are diagrammatic views of certain structures used for wafer testing.
Figure 1B:
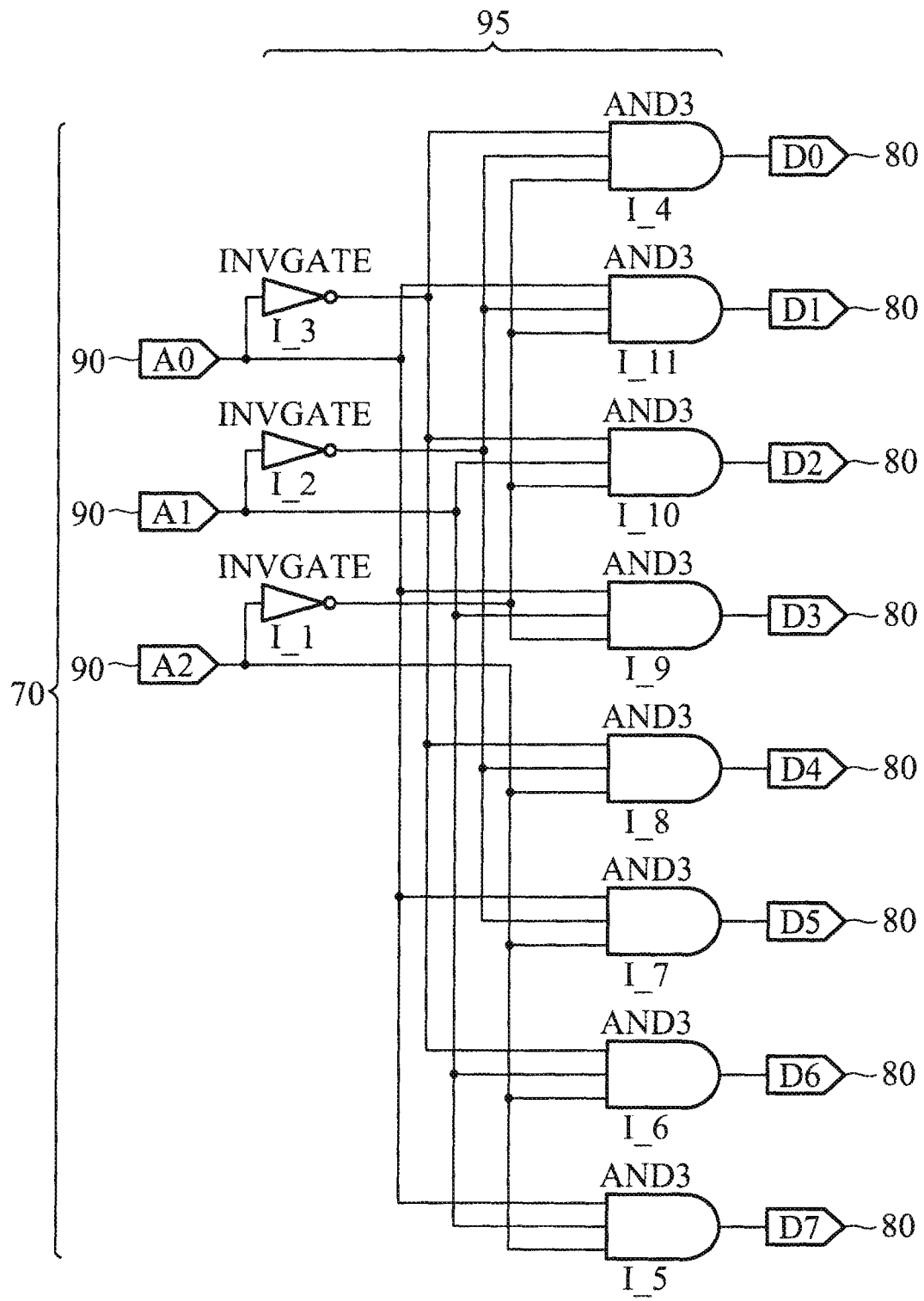

FIGS. 1A and 1B are circuit diagrammatic views of two example testing apparatuses for testing a semiconductor wafer. FIG. 1A illustrates a testing apparatus 40, which includes a plurality of testing units 50 (also referred to as test structures or device under test (DUT)) whose various terminals are each coupled to a respective one of a plurality of testing pads 60. The testing units 50 are designed and implemented for the electrical testing of a semiconductor circuit element or component, such as a transistor or a resistor. Thus, the testing units 50 may each contain one of the semiconductor elements or components. The testing pads 60 are conductive pads for establishing electrical connections between the terminals of the testing units 50 and external devices. Electrical currents or voltages may be applied to the testing pads 60.

FIG. 1B illustrates a testing apparatus 70, which includes a plurality of testing units 80 and a plurality of testing pads 90. The testing units 80 and the testing pads 90 are coupled together by a decoder 95. The decoder 95 may contain a multiplexer, inverters, and/or Boolean logic gates such as AND, OR, NAND, NOR, XOR gates. The decoder 95 is operable to establish electrical connections between one or more of the testing units 80 and the testing pads 90.

A limitation of the testing apparatus 40 of FIG. 1A and the testing apparatus 70 of FIG. 1B is that they require too many testing pads 60. For instance, for the testing apparatus 40, twenty-one testing pads are used to effectively test eight testing units. Testing pads consume area on the wafer, which has become an increasingly valuable resource as the chip scaling down process continues. Therefore, having an excessive number of testing pads wastes resources. The testing apparatus 70 requires fewer testing pads than the testing apparatus 40. In general, the testing apparatus 70 can support X number of testing units with Y number of testing pads, where X=2^Y. However, this means that as the number of testing units increase, the number of testing pads still increases, even if the increase is not in a linear manner. Modern semiconductor fabrication may require an ever larger number of testing units to effectively test the performance of the wafer. Thus, the testing apparatus 70 may not be able to handle the demands of modern semiconductor fabrication, because it may not be able to supply enough testing pads (to support the number of the testing units required by modern semiconductor fabrication).

Figure 2:
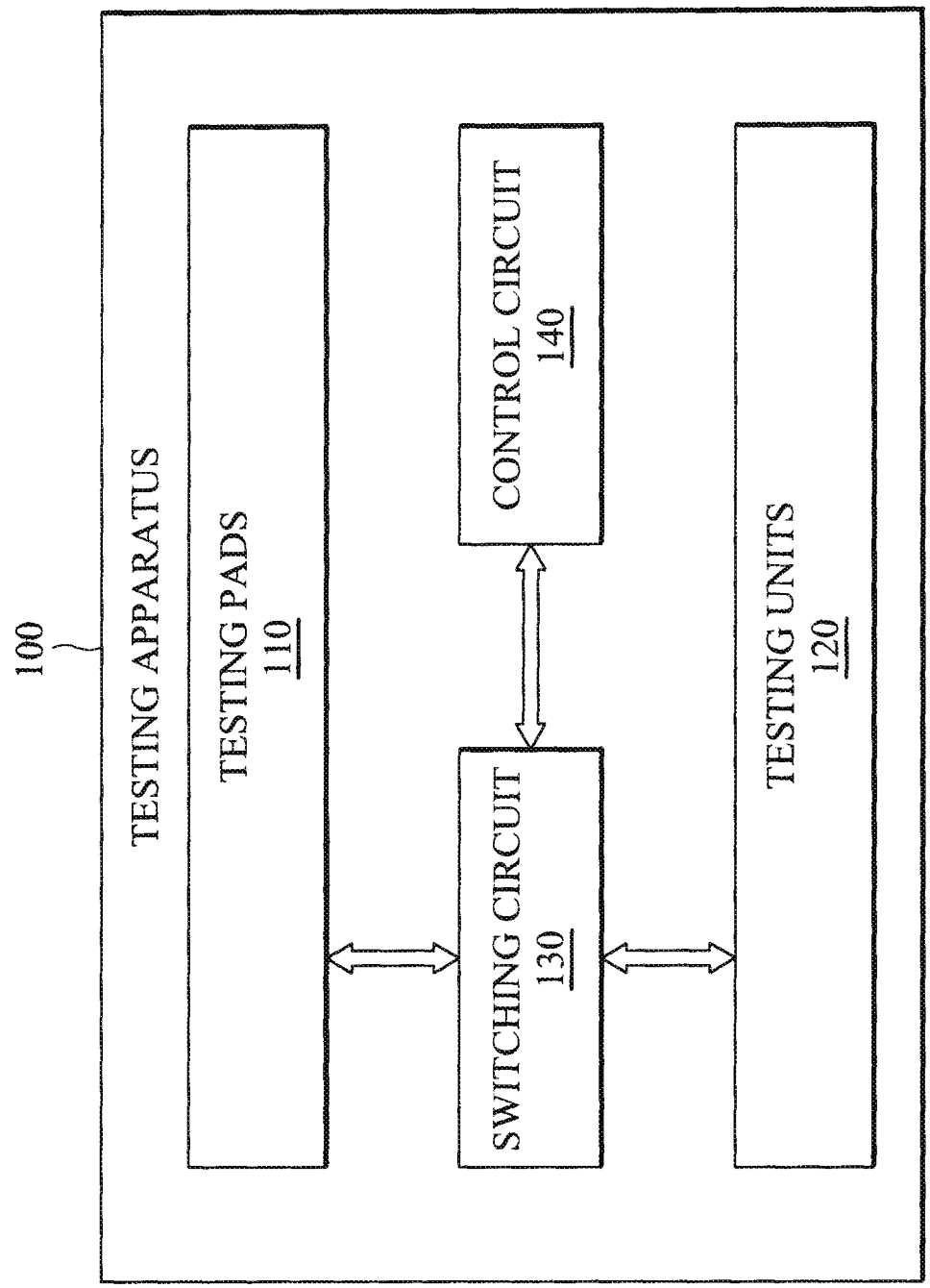
FIG. 2 is a diagrammatic view of a testing apparatus according to various aspects of the present disclosure.

To address these shortcomings discussed above, the present disclosure implements a testing apparatus that utilizes a control circuit and a switching circuit to select desired testing units. Referring to FIG. 2, a simplified block diagram of a testing apparatus 100 is illustrated. The testing apparatus includes a plurality of testing pads represented by block 110, a plurality of testing units (also referred to as test structures) represented by block 120, a switching circuit/circuitry 130 (also referred to as routing circuit/circuitry), and a control circuit/circuitry 140.

The testing pads 110 include a plurality of conductive testing pads, through each of which a test signal can be applied. The test signal may be an electrical current or an electrical voltage. The testing units 120 include a plurality of test units that are designed and implemented for the testing of semiconductor circuit elements or components. For example, a testing unit may include an active device such as a transistor (e.g., field-effect transistor FET or bipolar junction transistor BJT) or a passive device such as a resistor, capacitor, or inductor. Each of the testing units 120 includes one or more terminals for electrically coupling with other devices.

The testing pads 110 and the testing units 120 are coupled together by the switching circuit 130. The switching circuit 130 contains a plurality of switching devices that can be selectively activated and deactivated (turned on and off, or closed and opened). The switching devices are each coupled to a respective one of the terminals of the testing units. The operation of the switching circuit 130 is electrically coupled to and controlled by the control circuit 140. The control circuit 140 includes devices that can selectively activate the switching devices. In an embodiment, the control circuit 140 includes a plurality of flip-flop devices as the control devices. The testing pads 110, the testing units 120, the switching circuit 130, and the control circuit 140 are discussed below in more detail.

Figure 3:
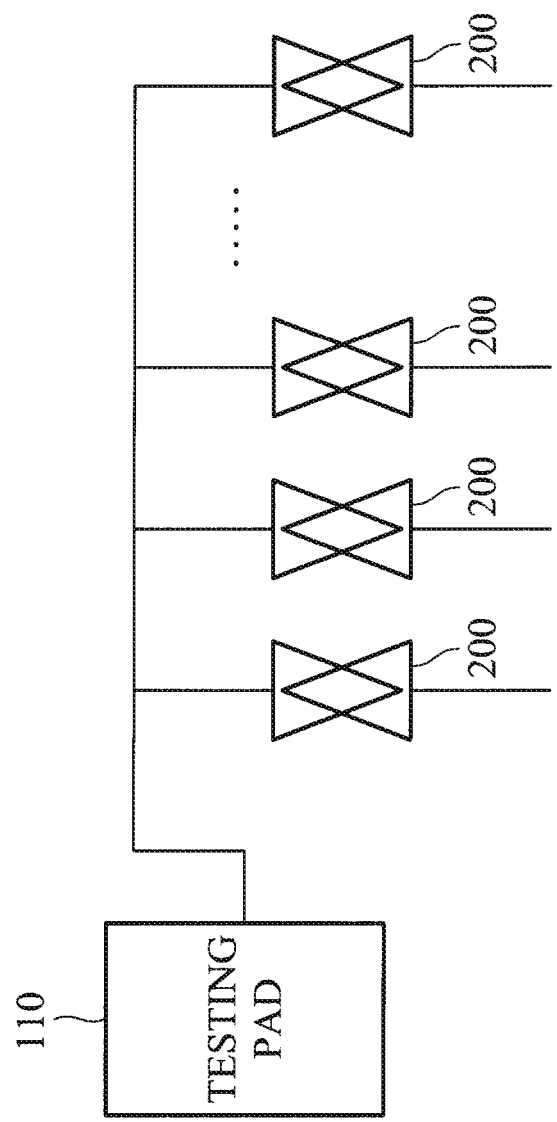
FIG. 3 is a diagrammatic view of a testing pad and a plurality of switching devices coupled thereto.

FIG. 3 illustrates a simplified circuit diagrammatic view of a testing pad 110 and a plurality of switching devices 200 coupled thereto. The testing pad 110 includes a conductive material, for example copper or aluminum. An electrical signal (for example, a test signal) can be applied to the testing apparatus disclosed herein through the testing pad 110. A commonly used testing WAT testing pad size is 50 microns (um)×50 um in a 60 um height scribe line, pad pitch 100 um and pad space 50 um; in general, pad number in a WAT test line is more than 20. It is understood that alternative sizes and dimensions of the testing pads and scribe lines may be employed for various optimization considerations.

As is illustrated, the testing pad 110 is coupled to a plurality of switching devices 200. The switching devices 200 are switching devices of the switching circuit 130 of FIG. 2. Each switching device can be selectively activated to let an electrical signal pass through, or deactivated to let no electrical signal pass through. Although not illustrated for the sake of simplicity, it is understood that the testing apparatus of the present disclosure includes a plurality of additional testing pads similar to the testing pad 110, wherein these testing pads are each coupled to a plurality of switching devices similar to the switching devices 200 of FIG. 3.

Figure 4:
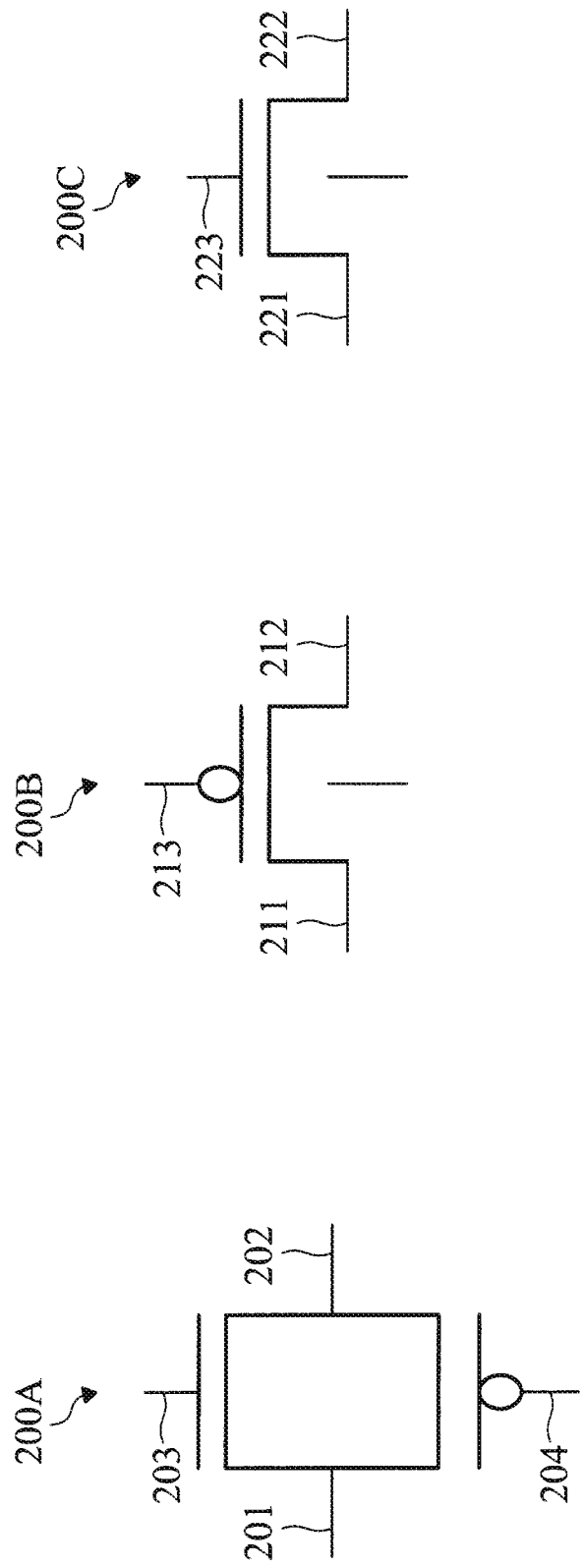
FIGS. 4A-4C are diagrammatic views of example switching devices.

FIGS. 4A-4B illustrate simplified circuit diagrams of different embodiments of the switching devices 200 of FIG. 3. In FIG. 4A, a switching device 200A includes a transmission gate. The transmission gate is implemented with a parallel combination of an NMOS transistor and a PMOS transistor. The signal at the gate of the NMOS transistor is complementary to the input at the gate of the PMOS transistor, or vice versa. For example, if a logical high (1) is applied at the gate of the NMOS transistor, then a logical low (0) is applied at the gate of the PMOS transistor. In an embodiment, the PMOS transistor has a larger width than the NMOS transistor, since the PMOS transistor has a lower mobility.

The switching device 200A has input/output terminals 201-202 and control terminals 203-204. A data signal can be sent through the input/output terminals 201-202 and pass through the switching device 200A with negligible signal loss. A control signal can be applied to the control terminals 203-204. The control signal determines whether the switching device 200A is activated (turned on) or deactivated (off). In this manner, the switching device 200A serves as a bidirectional tunable switch—data signal can travel from the terminal 201 to the terminal 202 or from the terminal 202 to the terminal 201.

In FIG. 4B, a switching device 200B includes a PMOS pass gate. The PMOS pass gate is implemented using a PMOS transistor device. Similar to the transmission gate in FIG. 4A, the PMOS pass gate has input/output terminals 211-212 through which a data signal can be applied, and a control terminal 213 through which a control signal can be applied to activate or deactivate the PMOS pass gate. In FIG. 4C, a switching device 200C includes an NMOS pass gate. The NMOS pass gate is implemented using an NMOS transistor device. Similar to the transmission gate in FIG. 4A, the NMOS pass gate has input/output terminals 221-222 through which a data signal can be applied, and a control terminal 223 through which a control signal can be applied to activate or deactivate the NMOS pass gate. It is understood that the switching devices 200A-200C shown in FIGS. 4A-4C are merely examples, and that other suitable switching devices may be employed in alternative embodiments.

Figure 5:
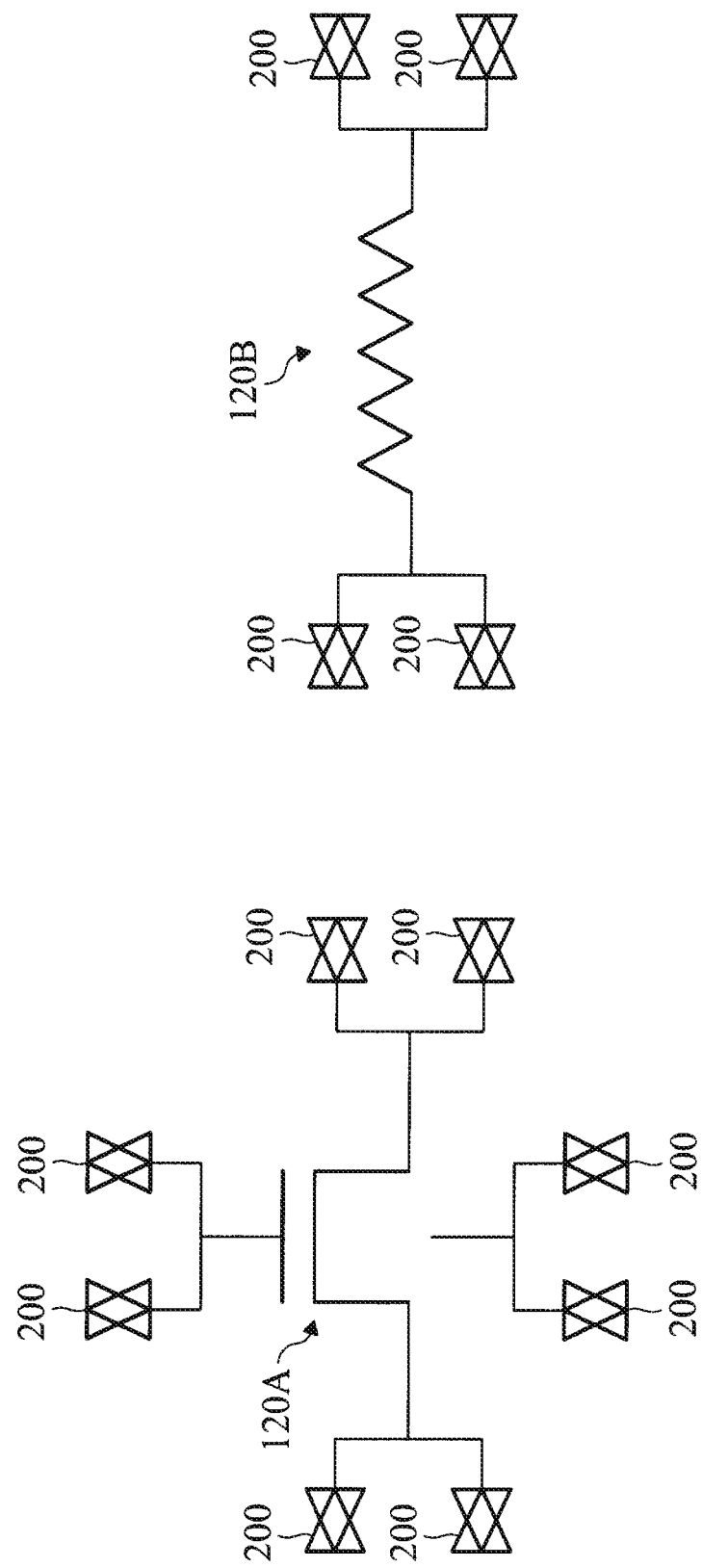
FIGS. 5A-5B are diagrammatic views of example testing units.

FIGS. 5A-5B include simplified circuit diagrams of example testing units that are embodiments of the testing units 120 shown in FIG. 2. In FIG. 5A, a testing unit 120A contains a transistor device, for example a FET transistor device. The transistor device has a gate terminal, a source terminal, a drain terminal, and a body terminal. Each of these terminals is coupled to two switching devices 200 (where the switching devices 200 may be implemented according to one of the embodiments shown in FIGS. 4A-4C or another suitable implementation). For each terminal of the transistor device, one of the switching devices 200 is used to force a signal (for example, an electrical current) to the terminal, and the other one of the switching devices 200 is used to sense a signal (for example, an electrical voltage) at the terminal. This type of forcing-sensing scheme can be used to compensate for circuit parasitics such as parasitic resistance.

In FIG. 5B, a testing unit 120B contains a resistor device. The resistor device has two terminals, each one of which is also coupled to two switching devices 200. Similar to the case in the testing unit 120A, one of the switching devices 200 can be used to force a current to a terminal of the testing unit 120B, while the other one of the switches 200 can be used to sense a voltage at that terminal. Each of the switches 200 of the testing units 120A and 120B is coupled to a respective one of the testing pads 110 shown in FIGS. 2-3. The forcing-sensing aspect of the testing according to the present disclosure will be discussed below in more detail with reference to FIGS. 10-12.

It is understood that the testing units of the testing apparatus disclosed herein may have different implementations or configurations than what has been illustrated. For example, some testing units may only have a subset of their terminals coupled to switching devices, while the other terminals are left open or are grounded. As another example, some testing units may only have one or more terminals that are each coupled to one switching device instead of to two switching devices. For the sake of simplicity, these additional testing units are not illustrated herein.

Figure 6:
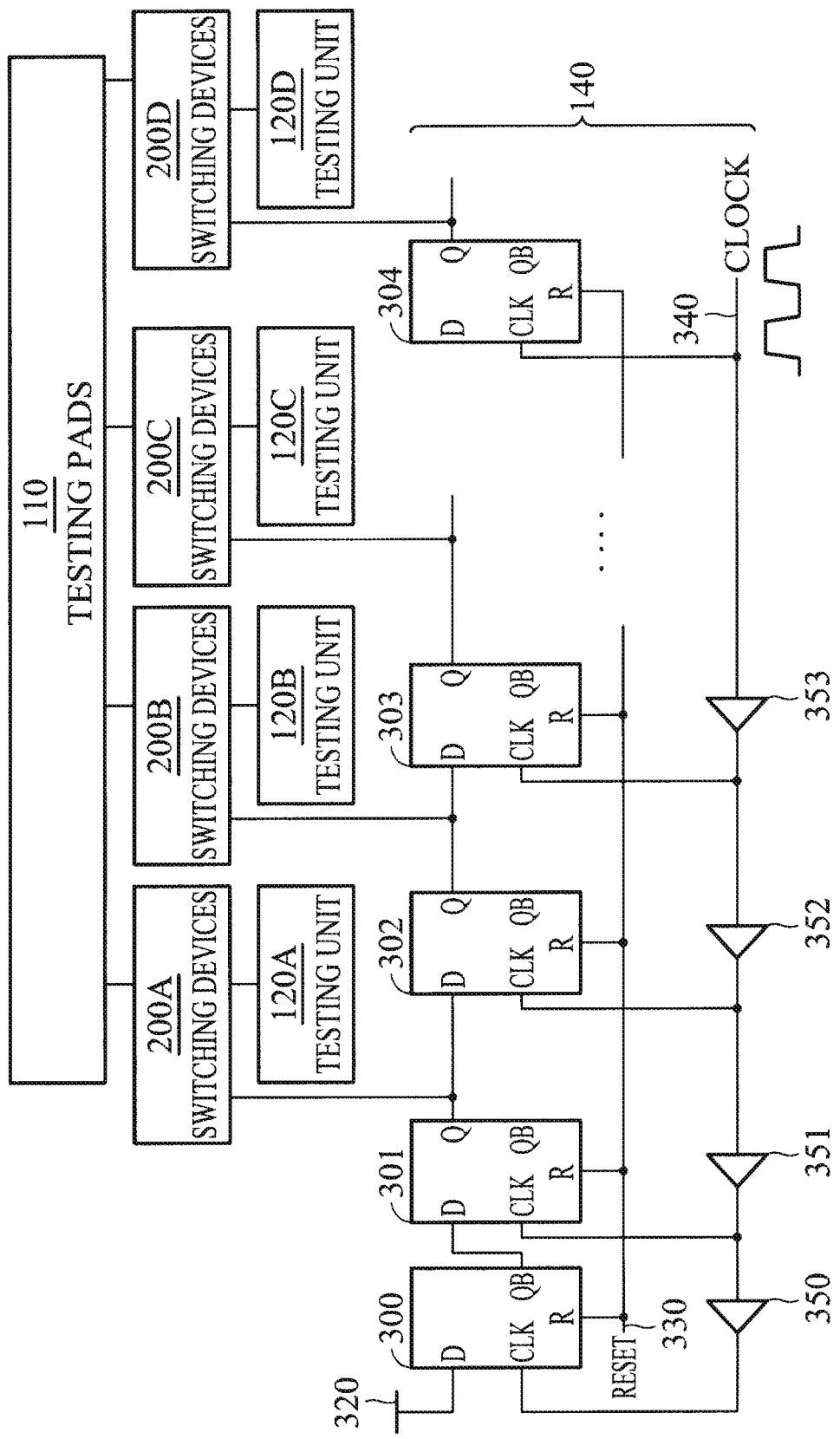
FIG. 6 is a diagrammatic view of a control circuit, the testing pads, the testing units, and the switching devices.

FIG. 6 illustrates a simplified fragmentary circuit diagram of an embodiment of the control circuit 140 of FIG. 2. The control circuit 140 contains a plurality of storage elements, some of which are illustrated herein as storage elements 300-304. The storage elements 300-304 can store a state, such as a logical high (1) state or a logical low (0) state. In the embodiment shown, the storage elements 300-304 are implemented with D (data) flip-flop devices. Therefore, the storage elements 300-304 may also be referred to as flip-flop devices hereinafter. These flip-flop devices each have a D (data) input, a CLK (clock) input, an R (reset) input, a Q output, and a QB output (opposite of the Q output).

The flip-flop devices 300-304 are coupled together in series. The flip-flop device 300 has its D input coupled to a signal source 320, which outputs a logic high signal (1) in the present embodiment. For example, the signal source 320 may be tied to a power-rail such as Vdd or Vss. The QB output of the flip-flop device 300 is coupled to the D input of the flip-flop device 301, but for the rest of the flip-flop devices 301-304, each preceding flip-flop device has its Q output coupled to the D input of the subsequent flip-flop device. As an example, the flip-flop device 301 (the preceding flip-flop device in this example) has its Q output coupled to the D input of the flip-flop device 302 (the subsequent flip-flop device in this example).

The flip-flop devices 300-304 also each have their R input coupled to a reset signal 330. When the reset signal 330 is actuated, all the flip-flop devices 300-304 are reset. The flip-flop devices 300-304 also each have their CLK input coupled to a clock signal 340. A plurality of buffers 350-353 are used to buffer the clock signal 340 before the clock signal is received by the CLK input of the flip-flop devices 300-303.

The Q outputs of flip-flop devices 301-304 are coupled to switching devices 200A-200D, respectively. The switching devices 200A-200D are respectively coupled between testing units 120A-120D and a subset of testing pads 110. In other words, the testing units 120A-120D "share" the subset of testing pads 110, but not at the same time. Electrical connections may be established between the subset of the testing pads 110 and a particular one of the testing units 120A-120D if the switching devices for that testing unit are activated.

For example, electrical connections may be established between the testing pads 110 and the testing unit 120A if the switching devices 200A are activated (turned on) while the switching devices 200B-200D are deactivated (turned off). Meanwhile, since the switching devices 200B-200D are deactivated, no electrical connections are established between the testing units 120B-120D and the testing pads 110. It is understood that if the switching devices are transmission gates, an inverter may also be coupled to the Q output of the respective flip-flop device, so that logically-complementary control signals may be provided to the transmission gates from that flip-flop device.

The flip-flop devices 301-304 disclosed herein are configured to turn on one set of switching devices at a time (according to clock pulses), so as to activate only one testing unit at any given time. Thus, electrical connections between that testing unit and at least a subset of testing pads is established, while no electrical connections exist between the rest of the testing units and that subset of testing pads.

In more detail, at each pulse of the clock signal 340, one of the flip-flop devices outputs a logical high control signal at its Q output. For example, the flip-flop device 301 outputs a logical high control signal at its Q output. This logical high control signal activates the switching devices 200A, which allows the testing unit 120A to be electrically coupled to the testing pads 110. Meanwhile, the other flip-flop devices 302-304 output a logical low during this clock pulse, which means that the switching devices 200B-200D are turned off. Consequently, testing units 120B-120D are not activated and have no electrical connections with the testing pads 110 at this time.

At the next clock pulse, the flip-flop device 302 outputs a logical high and activates the switching devices 200B. This allows electrical connections to be established between the testing unit 120B and the testing pads 110. Meanwhile, the flip-flop devices 301 and 303-304 output a logical low and deactivates the switching devices 200A and 200C-200D. Thus, no electrical connections exist between the testing pads 110 and the testing units 120A and 120C-120D.

In this manner, at each clock pulse, a different one of the testing units is activated (through the set of switching devices coupled thereto) and is allowed access to the testing pads 110. Electrical testing may be done to that testing unit at that time by applying testing signals through the testing pads. This configuration allows the number of testing pads to remain at a fixable low number, even as the number of testing units increases.

It is understood that a plurality of additional flip-flop devices (and the corresponding switching devices and testing units) exist between the flip-flop devices 303 and 304, but they are not illustrated herein for the sake of simplicity. It is also understood that in alternative embodiments, other suitable digital circuit devices may be used to implement the storage elements 300-304, for example SR (set-reset) flip-flops, JK flip-flops, or latches.

Figure 7:
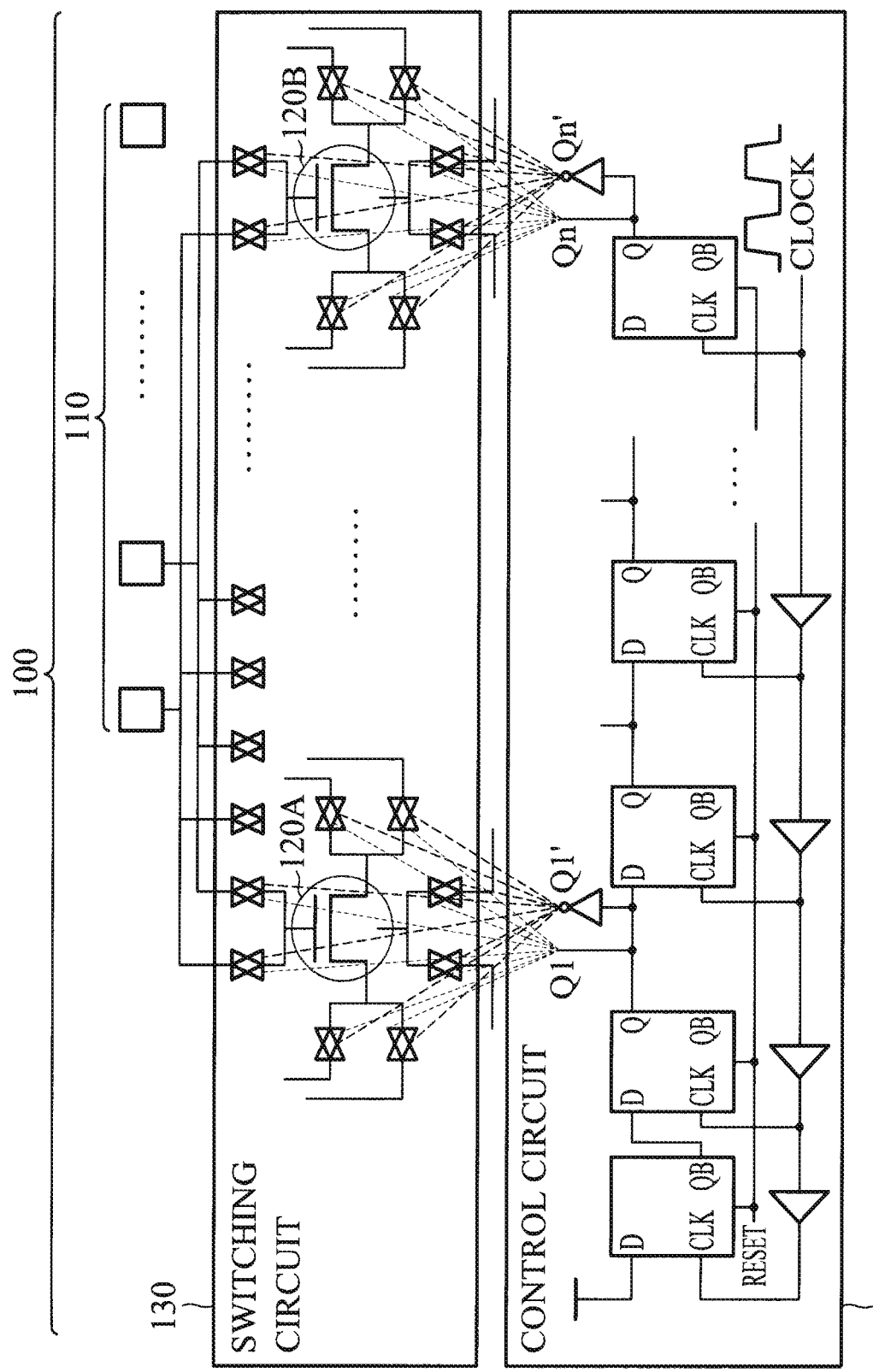
FIG. 7 is a diagrammatic view of a testing apparatus that includes the control circuit, the testing pads, the testing units, and the switching devices.

FIG. 7 is a fragmentary circuit diagrammatic view of the testing apparatus 100 of FIG. 2. The testing apparatus 100 includes the testing pads 110, the testing units 120, the switching circuit 130, and the control circuit 140. A subset of the testing pads 110 is shown. In an embodiment, the testing pads 110 include eight testing pads for coupling to the four terminals of a transistor device (two testing pads for each terminal, i.e., one testing pad for forcing a current, another testing pad for sensing a voltage), one testing pad for the application of the Vdd signal, one testing pad for the application of the Vss signal, one testing pad for the application of the clock signal, and one testing pad for the application of the reset signal. Thus, a total of twelve testing pads are used in that embodiment. It is understood that other number of testing pads may be employed in alternative embodiments.

For the sake of simplicity, only two of the testing units are shown in FIG. 7 as testing units 120A and 120B, which contain FET transistor devices. The four terminals (gate, source, drain, body/bulk) of each FET transistor device are each coupled to two the testing pads 110 through two respective switching devices. The switching circuit 130 contains a plurality of such switching devices, which may be implemented using transmission gates, PMOS pass gates, or NMOS pass gates, as discussed above. The operation (opening or closing) of the switching devices are controlled by the control circuit 140, which contains a plurality of storage elements such as D flip-flops.

As discussed above with reference to FIG. 6, at each clock pulse, a respective subset of the switching devices is activated so as to enable electrical coupling between one of the testing units (such as the testing unit 120A) and at least a subset of the testing pads 110. Thus, each testing unit may be tested using the same set of testing pads 110 without causing electrical shorting. Stated differently, a plurality of testing units may "share" a common set of testing pads, but in a time-divided manner. At any given point in time, only one testing unit has access to the testing pads 110.

Figure 8:
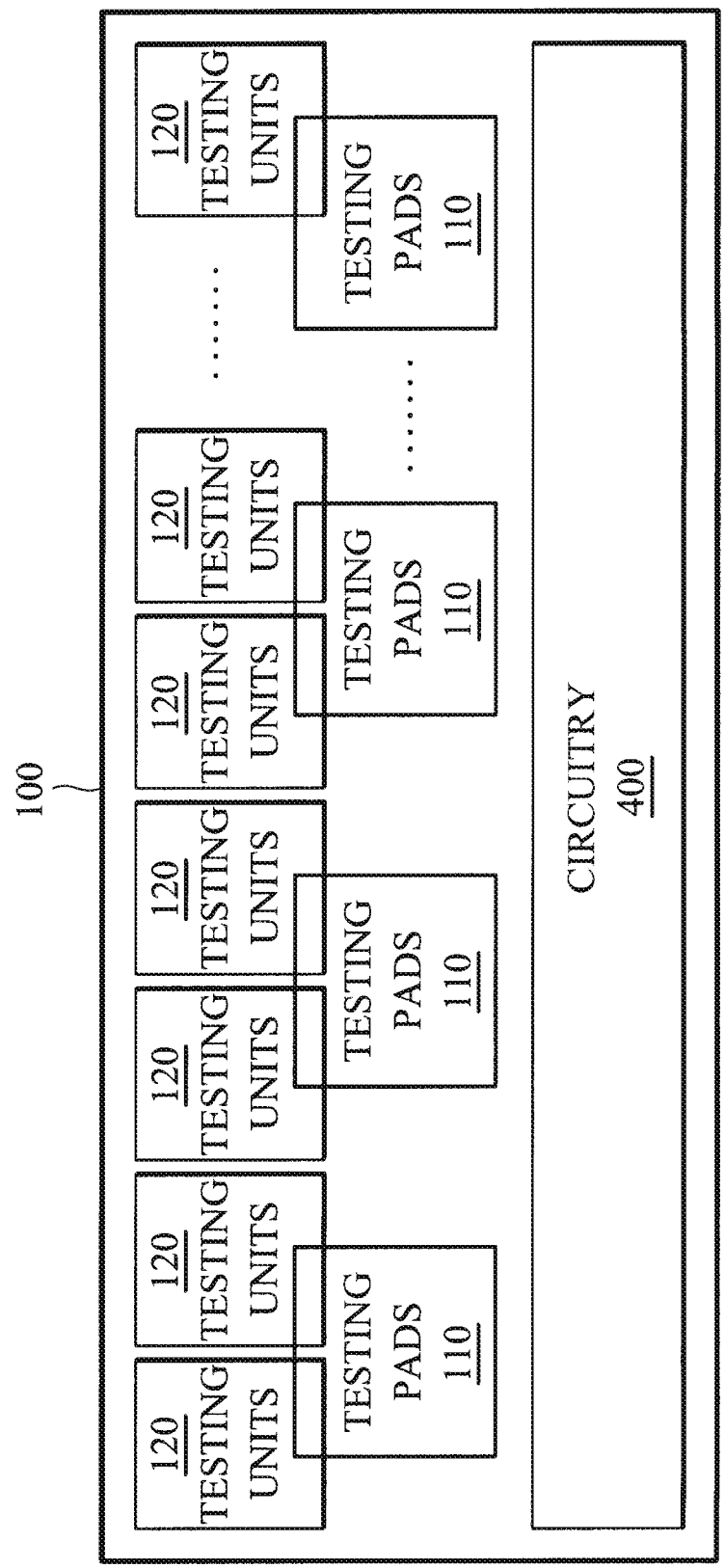
FIG. 8 is a diagrammatic top view of the testing apparatus that includes the control circuit, the testing pads, the testing units, and the switching devices.

FIG. 8 is a simplified diagrammatic top level view of the testing apparatus 100 (of FIG. 2). In an embodiment, the testing apparatus 100 is implemented in a scribe line region of a wafer. The scribe line region includes regions between rows or columns of IC devices. Wafer cutting may take place in the scribe line region. The testing apparatus 100 may also be referred to as a test line. The testing apparatus 100 includes a plurality of testing pads 110. In an embodiment, there are twelve testing pads: four testing pads for signals Vdd, Vss, CLOCK, and RESET, eight testing pads for the four terminals of a transistor device (two testing pads for each terminal). The testing apparatus 100 includes a plurality of testing units 120, for example hundreds or thousands or testing units. The testing pads 110 may have dimensions that are significantly larger than the dimensions of the testing units. The testing pads 110 and the testing units 120 may at least partially overlap.

The testing apparatus 100 also contains circuitry 400. The circuitry 400 includes the switching circuit 130 of FIG. 2, as well as the control circuit 140 of FIG. 2. The switching circuit 130 contains controllable switching devices coupled between the testing pads 110 and the testing units 120. As discussed above, the control circuit 140 contains storage elements such as flip-flop devices that can control the operation of the switching devices so as to control which testing unit can have electrical access to the testing pads 120. The dimensions of each testing pad may also be significantly larger than the individual switching devices and/or flip-flop devices.

Figure 9:
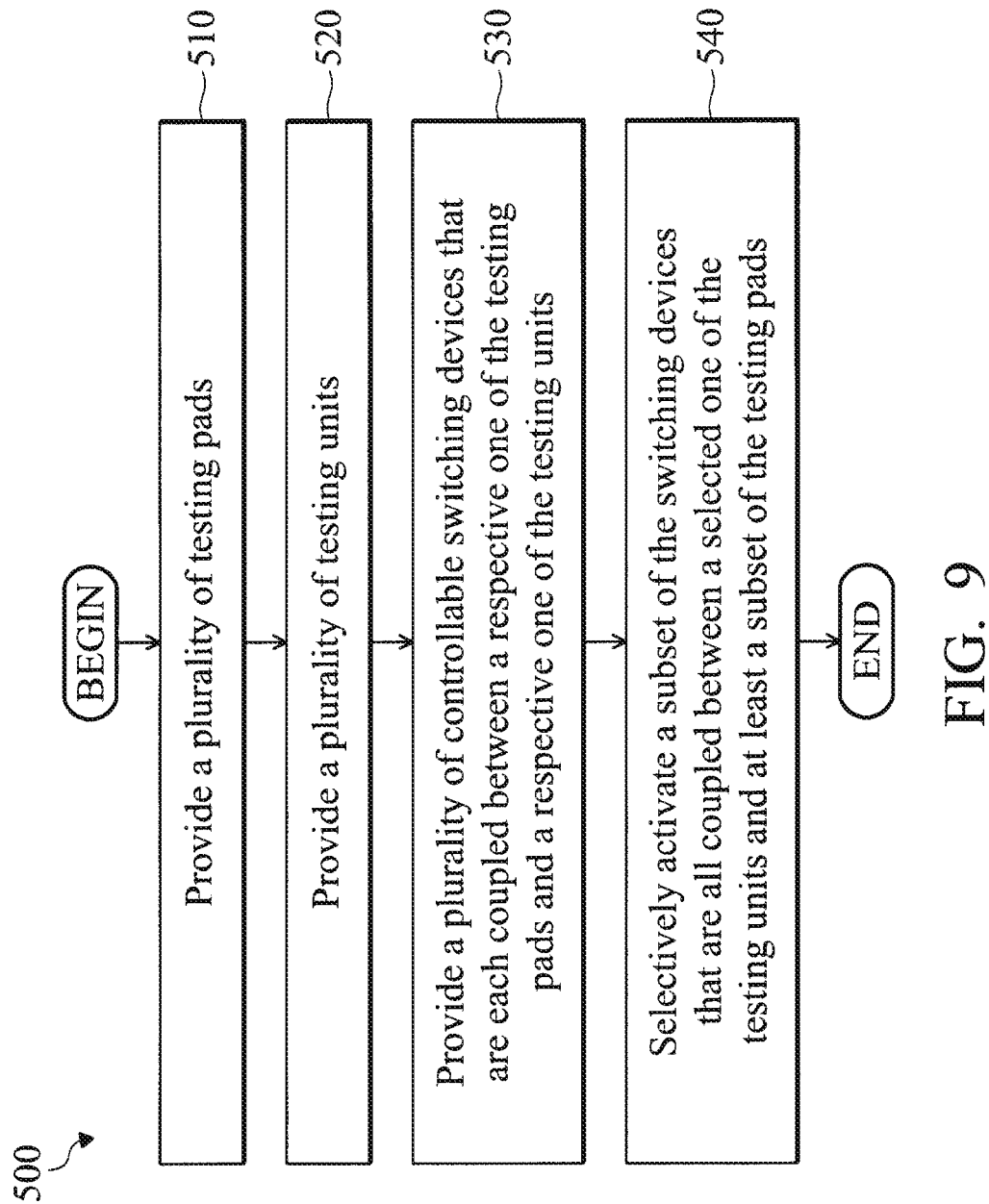
FIG. 9 is a flowchart illustrating a method for testing a wafer according to various aspects of the present disclosure.

Illustrate in FIG. 9 is a flowchart of a method 500 for testing a semiconductor device according to various aspects of the present disclosure. It is also understood additional processes may be provided before, during, and after the method 500 of FIG. 9, and that some other processes may only be briefly described herein.

Referring to FIG. 9, the method 500 begins with block 510 in which a plurality of testing pads is provided. The method 500 continues with block 520 in which a plurality of testing units is provided. The method 500 continues with block 530 in which a plurality of controllable switching devices is provided. The switching devices are each coupled between a respective one of the testing pads and a respective one of the testing units. The method 500 continues with block 540 in which a subset of the switching devices is selectively activated. The subset of the switching devices is all coupled between a selected one of the testing units and at least a subset of the testing pads. The execution of block 540 establishes electrical coupling between the selected testing unit and the subset of the testing pads.

Figure 10:
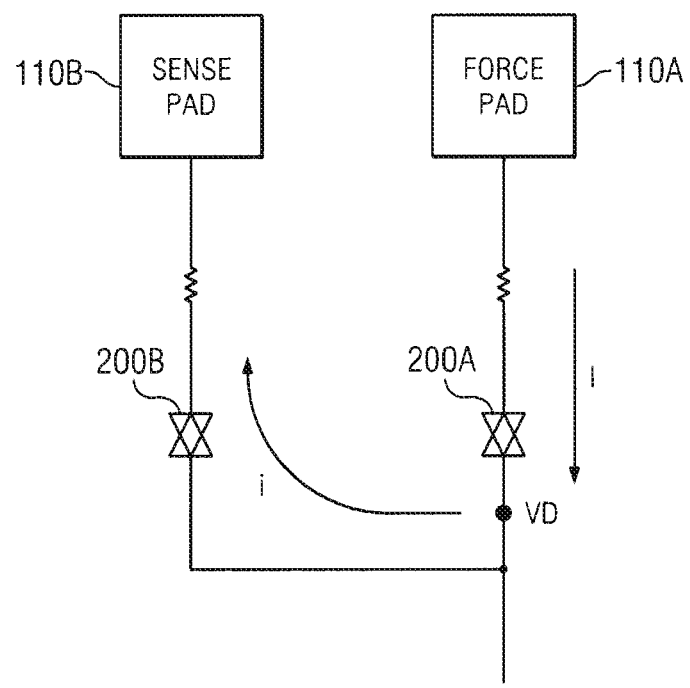
FIG. 10 is a circuit diagram illustrating a semiconductor testing compensation scheme.

Recall from the discussions above in association with FIGS. 5A-5B, two switching devices (or two testing pads) may be used for each terminal of a testing unit, one for forcing a current, the other one for sensing a voltage. This forcing-sensing scheme is implemented to compensate for electrical parasitics such as an IR voltage drop. Referring to FIG. 10, a circuit diagram of an example forcing-scheme is illustrated. A test current I is applied through a testing pad 110A (also referred to as a force pad). The test current I goes through switching device 200A before reaching a terminal of a testing unit (not illustrated). As an example, the testing unit may be a FET transistor, and the terminal coupled to the switching device 200A may be its drain terminal. Thus, a drain voltage "VD" is present at the drain terminal of the FET transistor.

It may be desired that the drain voltage VD is at a certain level, for example 0.9 volts (V). Circuit parasitics may affect the precision and accuracy of the drain voltage VD. Therefore, a feedback loop is created by a switching device 200B and a testing pad 110B (also referred to as a sense pad) coupled thereto. The testing pad 110B senses the voltage VD at the drain terminal. The difference between the sensed drain voltage and the desired drain voltage may be fed back to a control circuit (not illustrated in FIG. 10), which may be implemented within or separately from the control circuit 140 of FIG. 2. The control circuit can adjust the test current I (either adjusting it upwards or downwards) until the sensed drain voltage is substantially equal to the desired drain voltage. In this manner, the parasitic effects may be substantially compensated.

However, background electrical noise may still present a problem in certain situations. Especially for those small current test items such as Ioff, Ig, Ib and Vt, whose desired current level are around nano-Amp or pico-amp levels. For example, referring to FIG. 3, undesired leakage current may be produced by one or more of the switching devices 200 and/or the control circuit 130 of FIG. 2 (containing flip-flop devices). Leakage current may be generated by the switching devices even when they are deactivated. Since each testing pad 110 is coupled to a plurality of switching devices 200, as is shown in FIG. 3, the cumulative amount of leakage current may not be ignored, cumulative leakage current may cause a low S/N (signal/noise) ratio, for example, (test unit Ioff)/(switch devices background leakage)<100×. Therefore, the accurate test unit current measurement needs to minimize the background current to result in a S/N ratio greater than 100×.

The paragraphs below will discuss an approach to minimize the harmful effects of electrical noise such as leakage current. FIG. 11A illustrates a circuit diagrammatic view of a plurality of switching devices 200 that are coupled in parallel to a testing pad 110. The switching devices 200 are implemented as transmission gates in FIG. 11A. The switching devices 200 herein are switched off (deactivated) but still produce undesired leakage current, which can be measured as "Id" by the testing pad 110. Flip-flop devices of the control circuit that controls the operation of the switching devices 200 may also contribute to the leakage current.

FIG. 11B is a circuit diagrammatic view of one of the switching devices 200. In more detail, two complementary (NFET and PFET) transistor devices are electrically coupled by having their respective source and drain terminals tied together. The input and output of the switching device are taken from the source and drain terminals. The gates of the FET transistors serve as control terminals, which are coupled to the flip-flop devices of the control circuit (not illustrated herein for the sake of simplicity) in a manner described above with reference to FIGS. 6-7. The body or substrate terminal of the PFET transistor is tied to a power supply voltage "VDD", and the body or substrate terminal of the NFET transistor is tied to "VSS" serving as electrical ground.

FIG. 11C is an equivalent circuit diagrammatic view of the switching device illustrated in FIG. 11B. Namely, the NFET and PFET transistors can be modeled as diodes. The diode equivalent to the PFET transistor sources a leakage current onto the input terminal, and the diode equivalent to the NFET transistor sinks a leakage current from the input terminal. In other words, the direction of the leakage current flows of the PFET and NFET transistors are opposite: a leakage current flows out of the PFET transistor (and into the input terminal), whereas a leakage current flows into the NPFET transistor (from the input terminal). Another way of viewing this is that the leakage currents produced by the PFET and NFET transistors have opposite polarities: one is positive, the other one is negative.

Since the total amount of leakage current is a sum of the PFET transistor leakage current and the NFET transistor leakage current, the total leakage can be minimized if the PFET and NFET transistor leakage currents are manipulated to cancel each other out. One way to manipulate the PFET and NFET transistor leakage currents is through a sweeping of a supply voltage. This is at least in part due to the fact that a particular supply voltage will affect the PFET transistor leakage current differently than it does the NFET transistor leakage current. Stated differently, as the supply voltage is adjusted, different amounts of PFET and NFET leakage currents may be obtained.

Figure 11D:
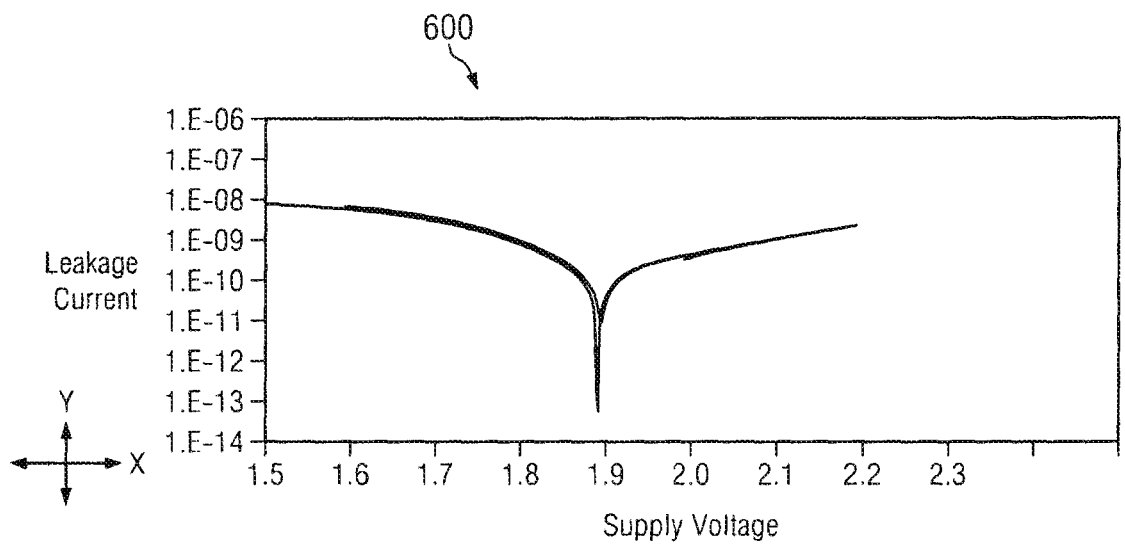
FIG. 11D is a graph illustrating a relationship between leakage current and supply voltage.

Referring to FIG. 11D, a graph 700 illustrates a relationship between a supply voltage and the total amount of leakage current. In the embodiment shown, the X-axis of the graph 600 represents the supply voltage, which is VDD. The Y-axis of the graph 600 represents the leakage current, which is the total amount of leakage current Id measured by the testing pad 110. Thus, the leakage current Id is the cumulative leakage current generated by all the electronic circuitry (including the switching devices and the flip-flop devices) coupled to the testing pad 110.

As is illustrated in FIG. 11D, the total leakage current changes as the supply voltage is swept along the X-axis. For example, when the supply voltage VDD is 1.5 V, the total leakage current is about 10 nano-amps (nA). As the supply voltage increases, the total leakage current begins to drop. When the supply voltage is at or near 1.9 V, the total leakage current is minimized, which is about 0.1 pico-amps (pA). After that, as the supply voltage increases, the leakage current begins to increase once again. For example, when the supply voltage is at about 2.2 V, the total leakage current is about 1 nA. Thus, in the embodiment illustrated in FIG. 11D, 1.9 V is an optimum value for the supply voltage VDD. This is because at VDD=1.9 V, the PFET leakage current and the NFET leakage current substantially cancel each other out, thereby resulting in a low overall leakage current. It is understood that these specific values discussed herein merely serve as examples, and that a supply voltage may have different values in other embodiments.

According to an embodiment, the following steps are performed to generate the chart 600. First, the flip-flop devices in the control circuit are reset, and all the switching devices are reset to be in an off state. Second, a test signal is applied through the testing pad to force a test voltage at a desired terminal of the testing unit. Third, the power supply voltage VDD of the control circuit and the switching devices is swept from a first value to a second value. Then an optimized power supply voltage VDD is obtained. The optimized power supply voltage VDD yields a minimum electrical background noise (e.g., a total amount of current leakage). Thereafter, the optimized power supply voltage VDD is adopted and used as the power supply voltage to power the flip-flop devices and the switching devices. The subsequent electrical testing of the testing unit can be performed at a high accuracy.

Figure 12:
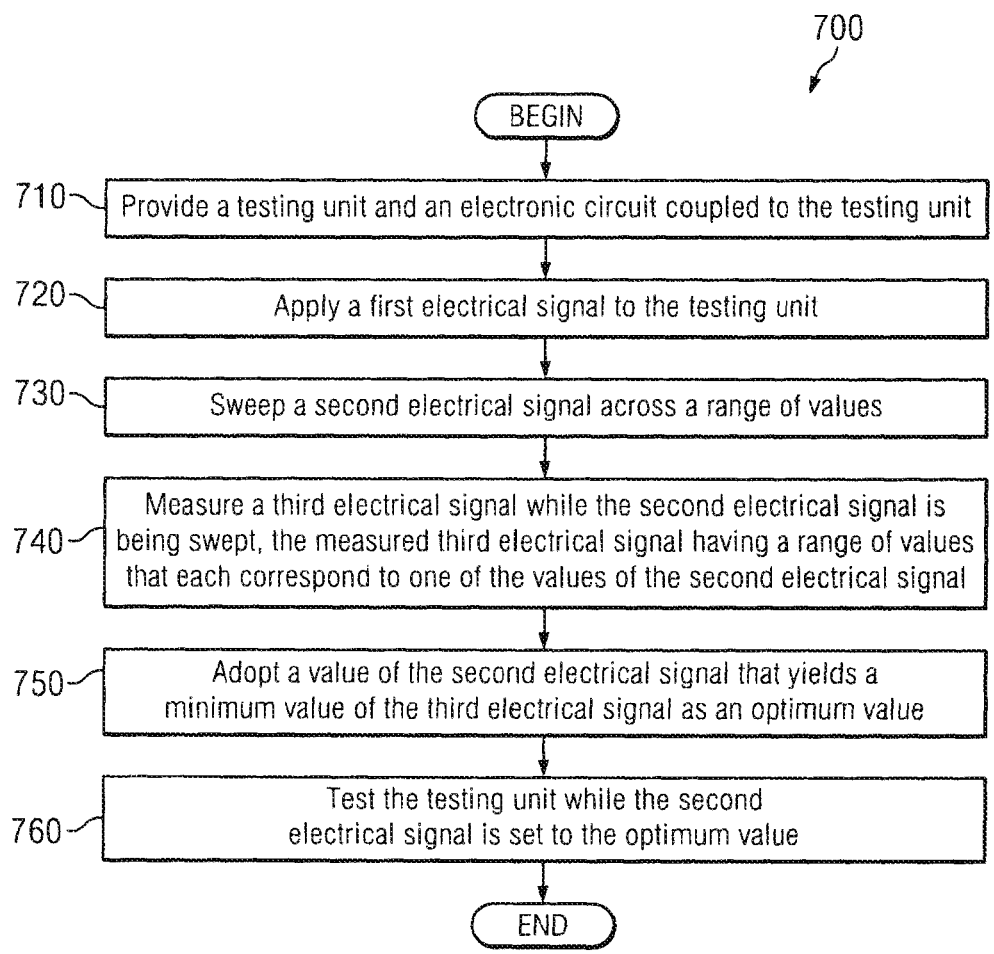
FIG. 12 is a flowchart illustrating a method of testing a semiconductor device according to various aspects of the present disclosure.

FIG. 12 is a flowchart that illustrates a method 700 for testing a semiconductor device according to various aspects of the present disclosure. The method 700 includes block 710, in which a testing unit and an electronic circuit are provided. The electronic circuit includes at least one of: switching circuitry and control circuitry. The electronic circuit contains a plurality of circuit components, such as transmission gates, pass gates, and flip-flop devices. The electronic circuit is coupled to the testing unit.

The method 700 includes block 720, in which a first electrical signal is applied to the testing unit. In an embodiment, the first electrical signal is a test voltage. In an embodiment, the block 720 includes forcing a voltage as the first electrical signal to a terminal of the testing unit.

The method 700 includes block 730 in which a second electrical signal is swept across a range of values. In an embodiment, the second electrical signal is a power supply voltage that supplies power to the electronic circuit. The sweeping of the second electrical signal is performed while a value of the first electrical signal remains substantially the same.

The method 700 includes block 740, in which a third electrical signal is measured during the sweeping of the second electrical signal. In an embodiment, the third electrical signal is a leakage current. The measured third electrical signal has a range of values that each correspond to one of the values of the second electrical signal. In an embodiment, the steps in blocks 720, 730, and 740 are all performed while the circuit components in the electronic circuit are turned off. In an embodiment, the steps in blocks 730 and 740 are carried out in a manner such that a value of the third electrical signal is obtained at each value of the second electrical signal.

The method 700 includes block 750, in which a value of the second electrical signal that yields a minimum value of the third electrical signal is adopted as an optimum value of the second electrical signal. The method 700 includes block 760, in which the testing unit is tested while the second electrical signal is set to the optimum value. The testing is performed while at least a subset of the circuit components of the electronic circuit is turned on.

It is understood that in accordance with the method 700, a plurality of testing pads and a plurality of additional testing units may be provided. Each testing pad is coupled to the testing unit and the additional testing units through the electronic circuit. The steps in the method 700 may be performed through at least a subset of the testing pads.

Since the method 700 discussed above involves sweeping the power supply voltage VDD, it may be referred to as a one-dimensional sweeping process. This one-dimensional sweeping process is capable of finding the optimum VDD to reduce current leakage noise in many applications. However, as process or device variations increase, the one-dimensional sweeping process may not be sufficient to cover all leakage situations. In other words, an "optimum" VDD value obtained from performing the one-dimensional VDD sweep may not actually be the best VDD value to minimize leakage current. This problem may be exacerbated if parallel testing is implemented, where multiple DUTs or testing units are tested concurrently. To address these issues, a multi-dimensional sweeping process is proposed by the present disclosure and discussed in more detail below.

Figure 13:
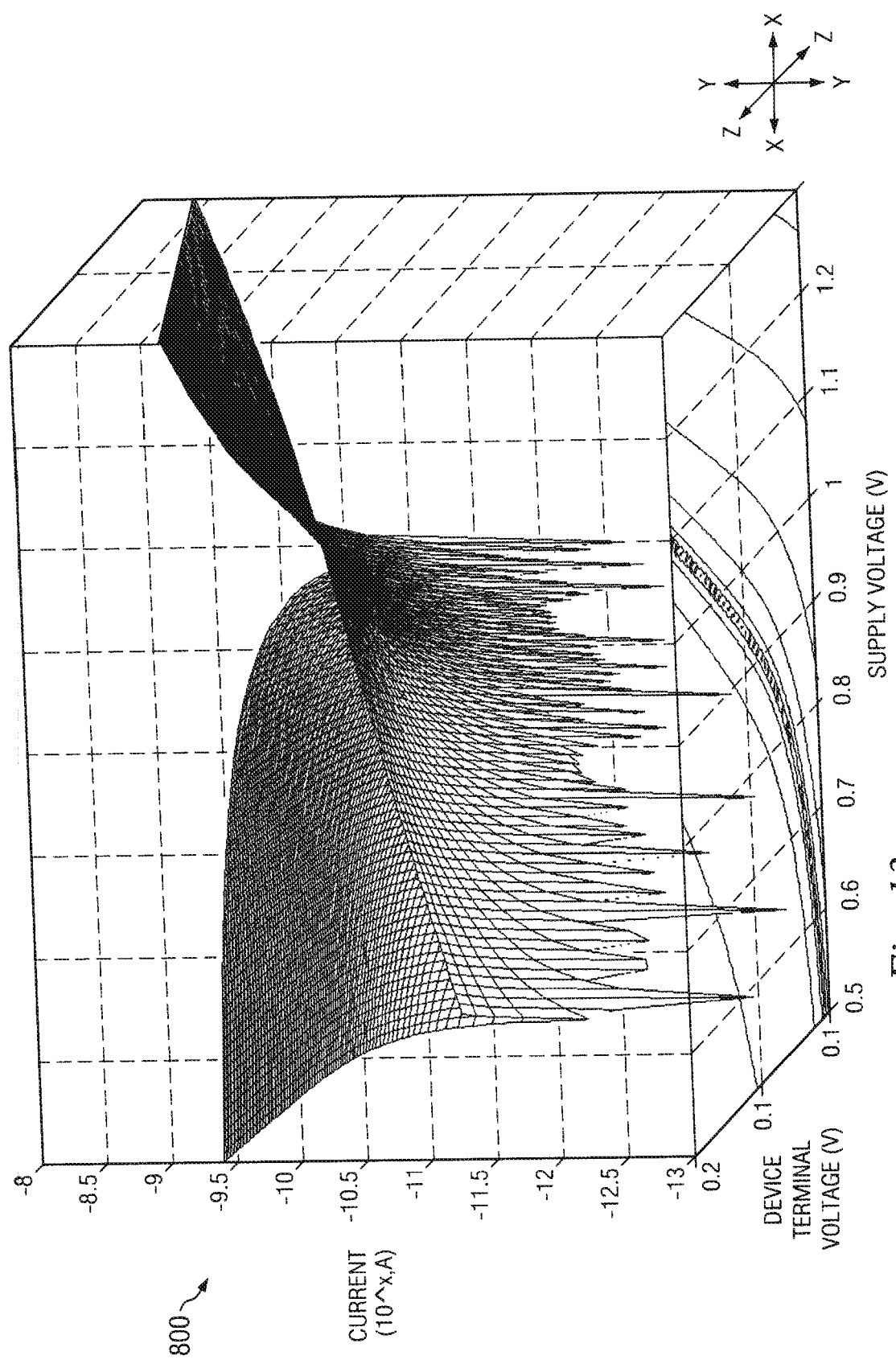
FIG. 13 is a three-dimensional graph illustrating a relationship between leakage current and supply voltage and device terminal voltage.

Referring to FIG. 13, a three-dimensional graph 800 illustrates a relationship between leakage current, device terminal voltage, and supply voltage. The X-axis of the graph 800 represents the supply voltage (also referred to as control circuit voltage), which is VDD in the present embodiment. The Y-axis of the graph 800 represents the leakage current, which is the total amount of leakage current Id measured by the testing pad 110. Thus, the leakage current Id is the cumulative leakage current generated by all the electronic circuitry (including the switching devices and the flip-flop devices) coupled to the testing pad 110. The Z-axis of the graph 800 represents the device terminal test voltage (also referred to as a force voltage, since the voltage is "forced" onto a terminal of a testing unit or DUT).

The X-axis, Y-axis, and Z-axis are orthogonal or perpendicular to one another. A "cut" along the X-axis would result in a two-dimensional plane defined by the X-axis and the Y-axis. The projection of the three-dimensional graph on that two-dimensional graph would appear as a graph that resembles the graph 600 of FIG. 11D. This is because such cut effectively uses a fixed device terminal voltage, which is how the one-dimensional sweep (sweeping supply voltage VDD along the X-axis) discussed above with reference to FIG. 11D is carried out.

However, it can be seen from graph 800 that the lowest leakage current may not necessarily be obtained by maintaining the device terminal voltage at a random given value. Rather, the leakage current, the device terminal voltage, and the supply voltage are all interdependent. In other words, leakage current varies in response to the device terminal voltage as well as to the supply voltage. Hence, to obtain the lowest leakage current, a multi-dimensional sweeping process with respect to the supply voltage and the device terminal voltage needs to be performed.

Figure 14:
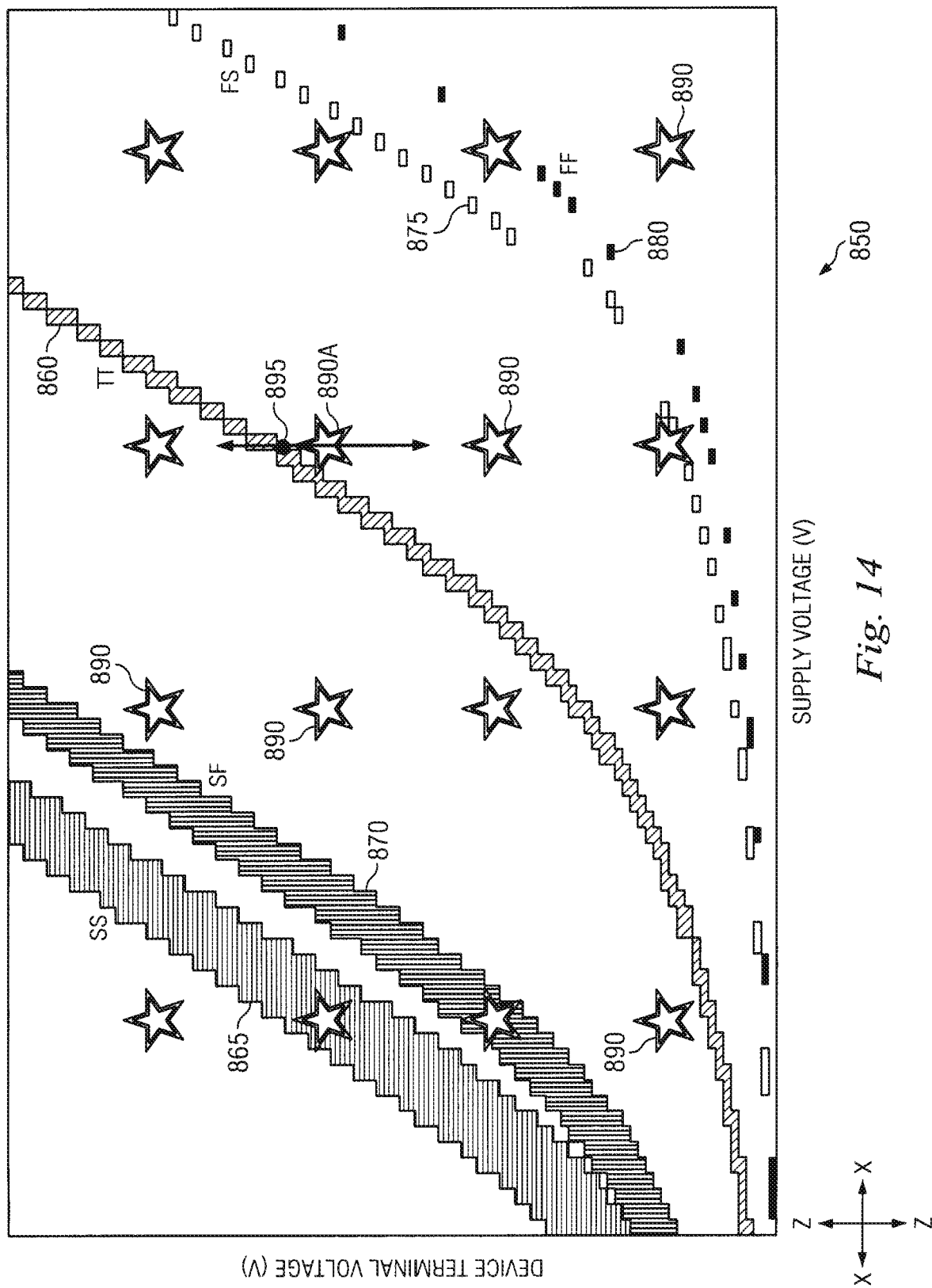
FIG. 14 is a two-dimensional graph illustrating a top view of the three-dimensional graph of FIG. 13.

Referring to FIG. 14, a two-dimensional graph 850 shows a top view of the graph 800 of FIG. 13. In other words, the graph 850 represents what can be observed by looking down along the Y-axis from the top of the graph 800 of FIG. 13. Therefore, the graph 850 is located in a plane that is defined by an X-axis that is the supply voltage, and a Z-axis that is the device terminal voltage. The graph 850 contains a curve 860 that represents a target performance. In an embodiment, the curve 860 represents the lowest amount of leakage current that can be obtained, which should be as close to zero as possible.

The graph 850 also contains curves 865, 870, 875, and 880. The curves 860-880 represent four different process corners, respectively. In an embodiment, the curve 865 represents the process corner in which an NFET is slow and a PFET is slow (SS), the curve 870 represents the process corner in which an NFET is slow and a PFET is fast (SF), the curve 875 represents the process corner in which an NFET is fast and a PFET is slow (FS), and the curve 880 represents the process corner in which an NFET is fast and a PFET is fast (FF). The leakage performance of a testing unit should be bound within these four process corners.

A multi-dimensional sweeping process is performed by sweeping both the supply voltage along the X-axis and the device terminal voltage along the Z-axis. Since there are two variables (supply voltage and device terminal voltage) in the embodiment illustrated, the multi-dimensional sweeping process is a two-dimensional sweeping process. However, it is envisioned that as more variables are involved, the multi-dimensional sweeping process may be a three-dimensional, four-dimensional, or any other dimensional sweeping process in alternative embodiments.

According to an embodiment, the multi-dimensional sweeping process is carried out using a nested loop structure. In general, a nested loop is a logical structure where two repeating loops are placed in "nested" form, that is, an inner loop is situated within the body of an outer loop. Each iteration of the outer loop triggers the execution of the inner loop, which may contain a plurality of cycles. According to an embodiment of the present disclosure, the inner loop is the sweeping across device terminal voltage, and the outer loop is the sweeping across supply voltage. As such, the execution of the nested loop involves sweeping the device terminal voltage across a desired range while the supply voltage is held at an initial value (i.e., the execution of the inner loop), and thereafter repeating the sweeping of the device terminal voltage a plurality of times, wherein each time the value of the supply voltage is increased (i.e., this is the execution of the outer loop).

The inner loop and outer loop may each be executed any number of times depending on their step sizes. As the step sizes decrease, the loops will be iterated more times. On the other hand, as the step sizes increase, the loops will be iterated fewer times. In one embodiment, both the inner loop and outer loop are iterated using small step sizes, for example step sizes in the range of a few milli-volts (mV) or one-tenths of mV. This embodiment will yield a supply voltage and a corresponding device terminal voltage that are respectively very close in value to the true optimum supply voltage and device terminal voltage that will result in the lowest leakage current possible. Hence, when a testing unit or DUT is tested using the supply voltage and the device terminal voltage obtained after executing the nested loop using small step sizes, a very low leakage current can be obtained. As such, the supply voltage and device terminal voltage values obtained in that embodiment may be practically considered to have optimum values.

However, one drawback of the embodiment discussed above is that it will take a long time to execute the nested loop due to the small step sizes. As an example, if the sweeping range and the step size are 1 V and 1 mV, respectively, for both the supply voltage and the device terminal voltage, it would take 1000×1000=1 million data samples (or measurement cycles) to complete the execution of the nested loop. The amount of time it takes to complete such nested loop may not be suitable for certain applications.

As a tradeoff, another embodiment (shown in FIG. 14) offers speed improvements by performing a coarse sweeping process first to obtain the optimum supply voltage, and thereafter performing a fine sweeping process to obtain the optimum device terminal voltage. In more detail, the coarse sweeping process involves executing the above-mentioned nested loop in a manner similar to the embodiment discussed above, except both the inner loop and the outer loop now have relatively large step sizes. In certain embodiments, the step sizes may be tens or hundreds of mVs. Consequently, the inner loop or the outer loop may each contain just a few iterations.

The coarse sweeping process yields a plurality of samples points 890, which are represented by the stars in graph 850. In other words, each data point (star) 890 is a result of an iteration of the nested loop and represents a leakage current obtained at a specific supply voltage and a specific device terminal voltage. Since the step sizes are big, the inner loop contains four cycles, as does the outer loop in the embodiment shown herein. Consequently, the nested loop contains 4×4=16 cycles or iterations, which can be performed quickly. But as a result of the big step sizes, the coarse sweeping process may very well miss the "sweet spot" of supply voltage and/or the device terminal voltage corresponding to the lowest amount of leakage current. This is visually indicated by the fact that none of the data points 890 in the graph 850 are located on the target curve 860. Therefore, the optimum value of only one of the two parameters (supply voltage and device terminal voltage) is defined by the execution of the coarse sweeping process. In an embodiment, the optimum supply voltage is defined by the execution of the coarse sweeping process. This supply voltage is obtained by identifying the data point 890A that is located closest to the target curve 860. The supply voltage value associated with the data point 890A will be recorded and fixed for the subsequent fine sweeping process.

Thereafter, a fine sweeping process is performed based using the data point 890A as a starting point. The fine sweeping process is performed while the supply voltage is held at the value associated with data point 890A. Device terminal voltage is swept along a desired range (along the Z-axis) with a smaller step size than that associated with the coarse sweeping process. The fine sweeping process will yield a data point 895, which is located at an intersection between the target curve 860 and the vertical Z-axis on which the data point 890A is swung. Thus, the data point 895 has the same supply voltage value as the data point 890A. The device terminal voltage associated with the data point 895 will be recorded as the optimum device terminal voltage.

The two-stage sweeping process (coarse sweeping plus fine sweeping) can be performed faster than the single stage fine sweeping process. The coarse sweeping process for the nested loop effectively locates the "neighborhood" (e.g., data point 890A) of the optimum data point. The coarse sweeping process can be performed in a short amount of time due to the relatively big step sizes. Thereafter, starting from this "neighborhood," the fine sweeping process then locates the optimum data point. The fine sweeping process can also be performed in a short amount of time because, although the step sizes are smaller, the sweeping range does not need to be very big. A small sweeping range along the Z-axis will likely lead to an intersection with the target curve 860 and therefore identify the optimum data point 895. Furthermore, the fine sweeping process also saves time because it is a one-dimensional loop, as it does not need to be nested within an outer loop.

In an embodiment, the coarse sweeping process is sufficient to account for process variations such as lot to lot variations, wafer to wafer variations, and within-wafer variations. The fine sweeping process is sufficient to account for within-die variations.

As discussed above, once the optimum supply voltage and the optimum device terminal voltage are identified—regardless of the specific method used to identify them—they are used during the testing of testing units or DUTs. In an embodiment, to increase testing efficiency and speed, a parallel testing scheme is implemented. In parallel testing, multiple testing units are tested at the same time. These concurrently tested testing units may be referred to as belonging to different sets. Each set contains a plurality of testing units. All the testing units within the same set share the same testing pads. However, testing units from different sets may not share the same testing pads, or only share a subset of the testing pads.

For example, in an embodiment where four testing units are tested concurrently, there are four sets of testing units. For ease of reference, these four sets may be referred to as set A, set B, set C, and set D. In an embodiment, testing units in sets A, B, C, D may each have its own dedicated testing pads, including terminal testing pads and power supply testing pads. In other words, the sets A, B, C, D are completely independent of one another. In that case, the testing of each set can be carried out in the manner described above, for example using a multi-dimensional sweeping process, which may include a coarse sweeping process followed by a fine sweeping process. An optimum supply voltage and an optimum device terminal voltage may be separately identified and used for each of the four sets A, B, C, and D, since each set may have its own optimum data point corresponding to the lowest leakage current.

In another embodiment, the four sets may share a subset of the testing pads such as power supply testing pads (e.g., testing pad for VDD). This may be done in the interest of conserving valuable chip area. In that case, the optimum supply voltage obtained by the coarse sweeping process may be shared for all four sets. Stated differently, one of the sets may be picked to run the coarse sweeping process so as to find the optimum supply voltage. Once found, this supply voltage will be used to run the fine sweeping process for each of the four sets, where the fine sweeping processes are performed independently and therefore may yield somewhat different optimum device terminal voltages.

Figure 15A:
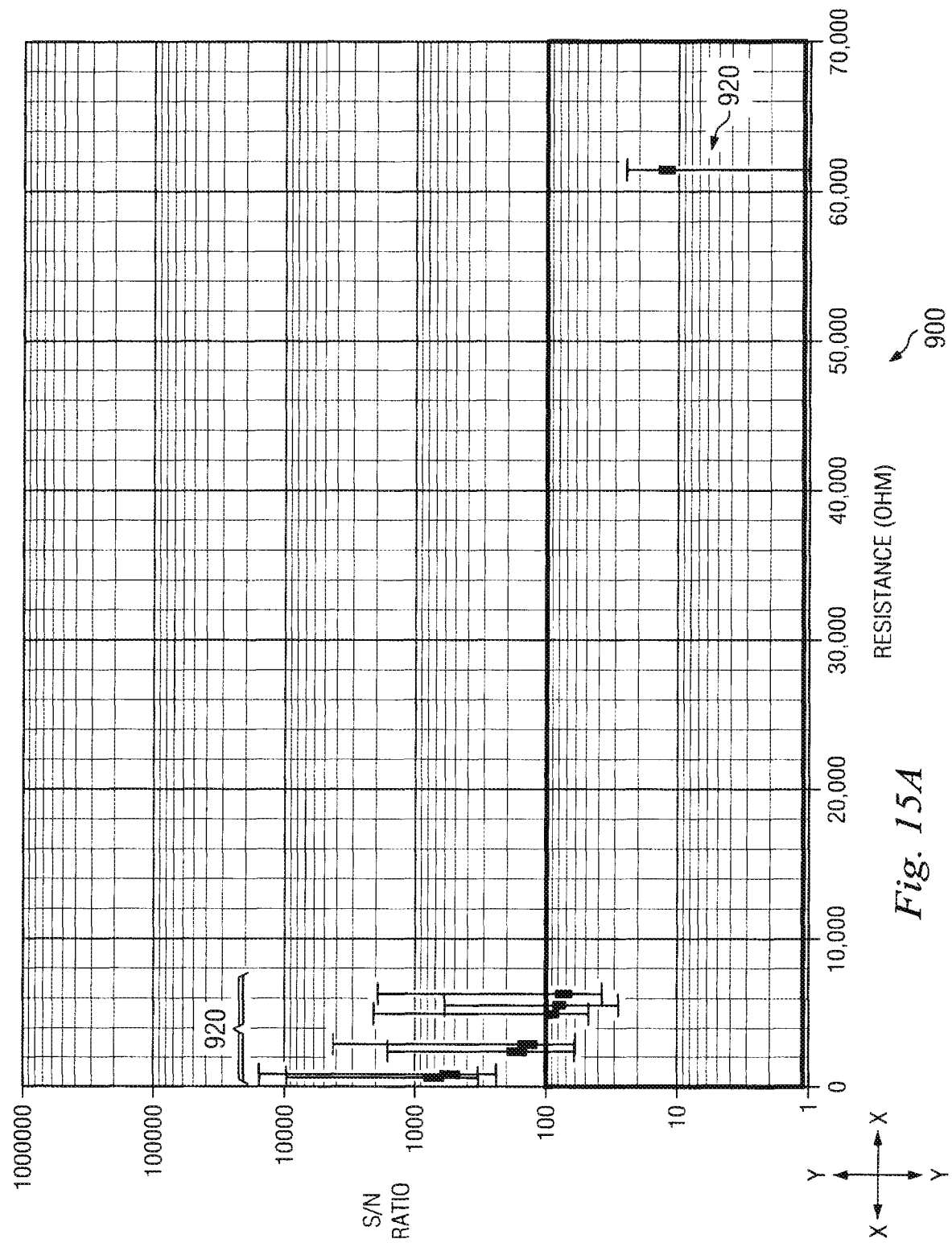
FIGS. 15A and 15B are plots of signal-to-noise (S/N) ratio performances associated with different testing methods, respectively.
Figure 15B:
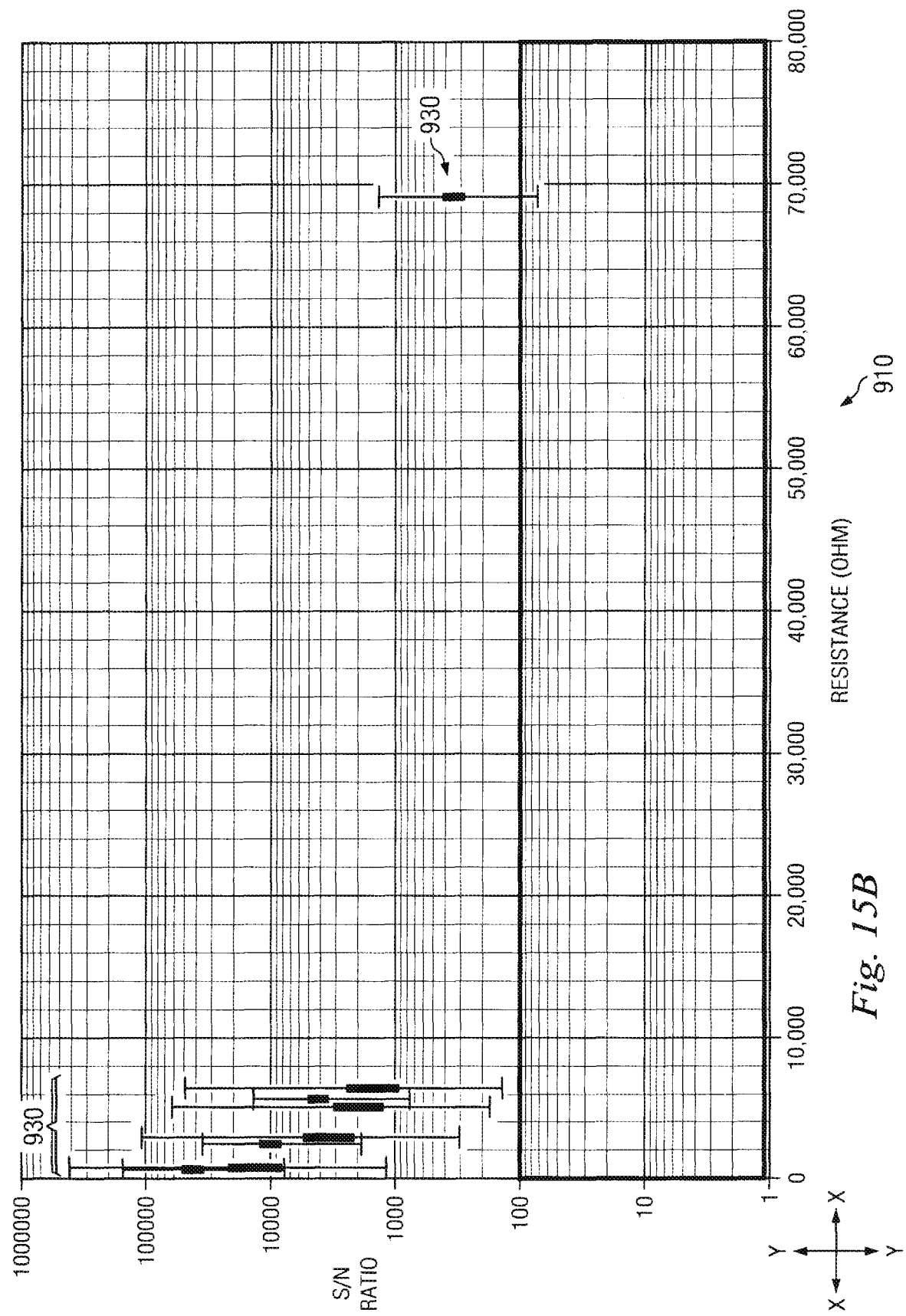

Since the multi-dimensional sweeping process discussed above can substantially reduce electrical noise such as leakage current, a better signal-to-noise (S/N) ratio can be obtained. This is illustrated in FIGS. 15A and 15B, wherein FIG. 15A illustrates a graph 900 that is a box plot of S/N performance corresponding to conventional testing methods, and wherein FIG. 15B illustrates a graph 910 that is a box plot of S/N performance corresponding to the multi-dimensional testing method discussed above. An X-axis of the graphs 900-910 represents resistance, and a Y-axis of the graphs 900-910 represents S/N ratio. Resistors are used as testing units herein.

Referring to FIG. 15A, the graph 900 contains a plurality of lines 920 that extend vertically along the Y-axis. Each line 920 represents a performance of S/N at a particular resistance range. Collectively, these lines 920 span a plurality of resistance values and S/N ratios. Due to the presence of electrical noise (such as leakage current), the S/N ratio is degraded. Suppose the minimum required S/N is 100, it can be seen that many of the lines 920 corresponding to resistances less than about 10,000 ohms drop below the S/N ratio of 100. One of the lines 920 corresponding to a resistance value of about 60,000 ohms fails the S/N requirement of 100 entirely. Thus, many of the resistors will not pass testing. This is unfortunate because in actuality, some of these resistors may have passing true S/N performance, but the S/N measurement is clouded or "contaminated" by the leakage current noise. As a result, such resistors (especially ones who are marginally passing the S/N requirement) may end up failing the S/N test. It may be difficult to ascertain which of the resistors indeed have failing S/N ratios because their S/N performances are not good, or which of the resistors only appear to have failing S/N ratios due to measurement inaccuracy caused by leakage current. Hence, some good resistors may be unnecessarily discarded.

In comparison, the graph 910 is compiled using the multi-dimensional testing method discussed above. Hence, leakage current is substantially reduced, which improves measurement accuracy. As a result, S/N ratio is substantially improved. Among its lines 930, only one of which (corresponding to a resistance of about 70,000 ohms) is actually dropping into the failing S/N territory of S/N<100. The rest of the lines 730 all have passing S/N performance. Therefore, it can be seen that the multi-dimensional sweeping process improves test measurement accuracy by minimizing leakage current.

It is understood that the multi-dimensional process discussed above may be applied to a variety of testing units. For example, in the embodiments discussed above, a resistor is used as a testing unit, where the variables for the multi-dimensional loop include the supply voltage (VDD) and the device terminal voltage (voltage forced at a terminal of the resistor device). In alternative embodiments, a transistor such as a FET device may be used as a testing unit, where the variables for the multi-dimensional loop may include a supply voltage (VDD) and a substrate bias voltage (voltage forced at a substrate terminal of the FET device). In is envisioned that alternative devices and their corresponding variables may be used for other embodiments.

Figure 16:
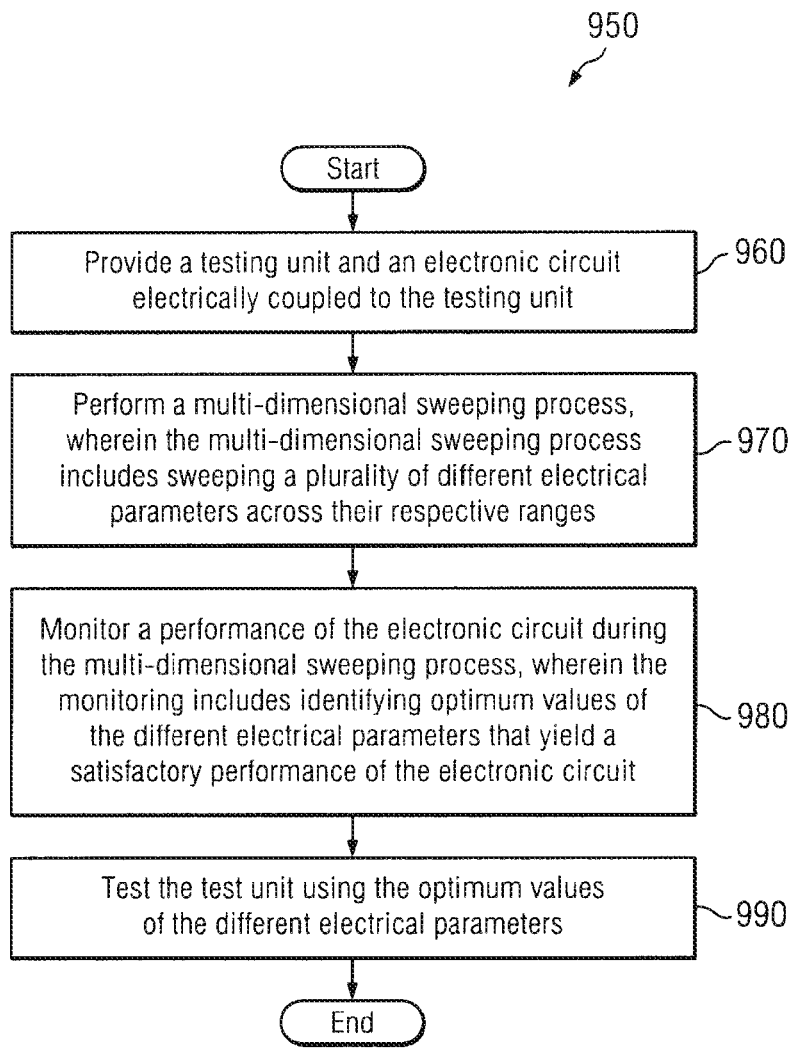
FIG. 16 is a flowchart illustrating a method for testing a wafer according to various aspects of the present disclosure.

FIG. 16 is a flowchart that illustrates a method 950 for testing a semiconductor device according to various aspects of the present disclosure. The method 950 includes block 960, in which a test unit and an electronic circuit are provided. The electronic circuit is electrically coupled to the test unit. The method 950 includes block 970, in which a multi-dimensional sweeping process is performed. The multi-dimensional sweeping process includes sweeping a plurality of different electrical parameters across their respective ranges. The method 950 includes block 980, in which a performance of the electronic circuit during the multi-dimensional sweeping process is monitored. The monitoring includes identifying optimum values of the different electrical parameters that yield a satisfactory performance of the electronic circuit. The method 950 includes block 990, in which the test unit is tested using the optimum values of the different electrical parameters.

Figure 17:
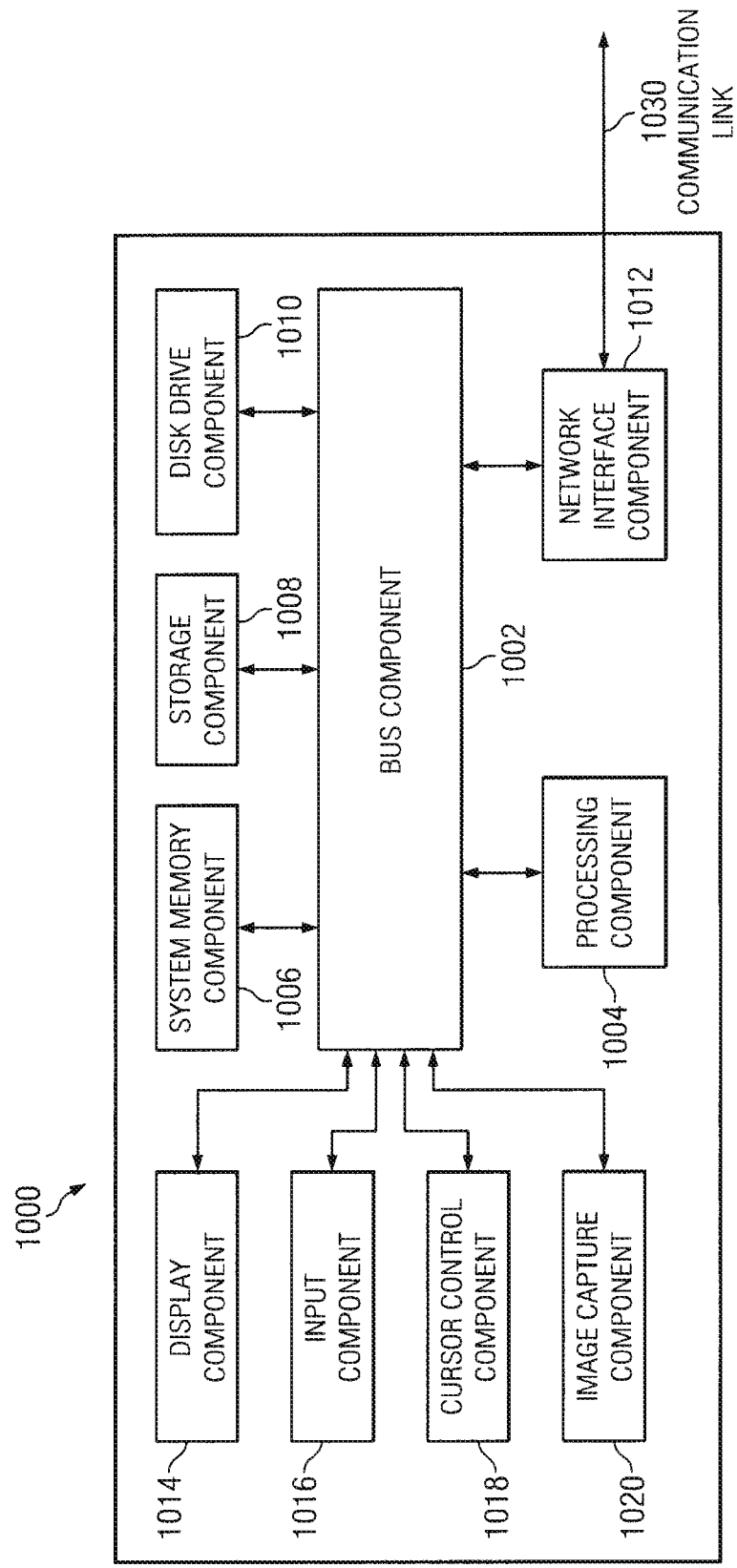
FIG. 17 is a block diagram of a computer system for performing the steps of the methods illustrated in FIGS. 9, 12, and 16.

FIG. 17 is a block diagram of a computer system 1000 suitable for implementing the various methods and devices described herein, for example, the various method blocks of the method 500 in FIG. 9, the method 700 in FIG. 12, and the method 950 in FIG. 16. In various implementations, the computer system 100 includes network communications devices (e.g., servers, laptops, personal computers, etc.) capable of communicating with a network.

In accordance with various embodiments of the present disclosure, the computer system 1000 includes a bus component 1002 or other communication mechanisms for communicating information, which interconnects subsystems and components, such as processing component 1004 (e.g., processor, micro-controller, digital signal processor (DSP), etc.), system memory component 1006 (e.g., RAM), static storage component 1008 (e.g., ROM), disk drive component 1010 (e.g., magnetic or optical), network interface component 1012 (e.g., modem or Ethernet card), display component 1014 (e.g., cathode ray tube (CRT) or liquid crystal display (LCD)), input component 1016 (e.g., keyboard), cursor control component 1018 (e.g., mouse or trackball), and image capture component 1020 (e.g., analog or digital camera). In one implementation, disk drive component 1010 may comprise a database having one or more disk drive components.

In accordance with embodiments of the present disclosure, computer system 1000 performs specific operations by processor 1004 executing one or more sequences of one or more instructions contained in system memory component 1006. Such instructions may be read into system memory component 1006 from another computer readable medium, such as static storage component 1008 or disk drive component 1010. In other embodiments, hard-wired circuitry may be used in place of (or in combination with) software instructions to implement the present disclosure.

Logic may be encoded in a computer readable medium, which may refer to any medium that participates in providing instructions to processor 1004 for execution. Such a medium may take many forms, including but not limited to, non-volatile media and volatile media. In one embodiment, the computer readable medium is non-transitory. In various implementations, non-volatile media includes optical or magnetic disks, such as disk drive component 1010, and volatile media includes dynamic memory, such as system memory component 1006. In one aspect, data and information related to execution instructions may be transmitted to computer system 1000 via a transmission media, such as in the form of acoustic or light waves, including those generated during radio wave and infrared data communications. In various implementations, transmission media may include coaxial cables, copper wire, and fiber optics, including wires that comprise bus 1002.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice the present disclosure may be performed by computer system 1000. In various other embodiments of the present disclosure, a plurality of computer systems 1000 coupled by communication link 1030 (e.g., a communications network, such as a LAN, WLAN, PTSN, and/or various other wired or wireless networks, including telecommunications, mobile, and cellular phone networks) may perform instruction sequences to practice the present disclosure in coordination with one another.

Computer system 1000 may transmit and receive messages, data, information and instructions, including one or more programs (i.e., application code) through communication link 1030 and communication interface 1012. Received program code may be executed by processor 1004 as received and/or stored in disk drive component 1010 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as computer program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The embodiments disclosed herein offer advantages over existing testing apparatuses, it being understood that other embodiments may offer different advantages, and that no particular advantage is required for all embodiments. One advantage is the reduction of the number of testing pads. This is because the testing pads can now be "shared" by all the testing units in a time-divided manner. Typically, the testing pads take up much more room in a test line than the testing units, the control circuit, or the switching circuit. In other words, the implementation of the switching circuit, the control circuit, and/or extra testing units may not consume much chip area. In comparison, the reduction in the number of testing pads (for example from at twenty-one testing pads down to twelve) results in significant savings in chip area consumption, which may lead to lower fabrication costs.

In addition, the embodiments disclosed herein can handle a greater number of testing units than existing test lines. As discussed above, existing test lines may require more and more testing pads as the number of testing units continue to increase, which is the trend of modern semiconductor fabrication. At some point, the traditional test line may run out of space and may not be able to handle the additional testing units. Here, the number of testing pads can stay below a relatively low number, regardless of the number of testing units. As such, the embodiments disclosed herein are more adapted to handle the demands of modern (and future) semiconductor fabrication through its capability of tolerating an increasing number of testing units.

Furthermore, the embodiments disclosed herein are easy to implement and may not require extra fabrication processes. The switching circuit and the control circuit can be easily integrated into existing fabrication process flow.

Another advantage of the embodiments disclosed herein is the greater measurement accuracy it offers. The algorithms described above in FIG. 12 (one-dimensional sweeping process) and FIG. 16 (multi-dimensional sweeping process) may be used to identify an optimum value for a power supply voltage and a device terminal voltage that correspond to a minimized electrical leakage current. Thus, overall background noise can be reduced, and the device under test (DUT) can be measured more accurately during its testing. For example, the present disclosure allows current measurements down to the nano-amp level. In addition, the parallel testing configuration means that overall testing efficiency and speed may be improved as well.

One of the broader forms of the present disclosure involves a semiconductor testing apparatus. The testing apparatus includes: a plurality of testing pads; a plurality of testing units; a switching circuit coupled between the testing pads and the testing units, the switching circuit containing a plurality of switching devices; and a control circuit coupled to the switching circuit, the control circuit being operable to establish electrical coupling between a selected testing unit and one or more of the testing pads by selectively activating a subset of the switching devices.

Another one of the broader forms of the present disclosure involves a device for testing a semiconductor wafer. The device includes: a plurality of conductive test pads through which electrical signals can be applied; a plurality of test structures each containing a semiconductor circuit component; routing circuitry containing a plurality of controllable switches that each include a control terminal and input/output terminals, wherein each switch is coupled between a respective one of the test pads and a respective one of the test structures through its input/output terminals; and control circuitry containing a plurality of storage elements driven by a clock signal, wherein an output of each of the storage elements is coupled to a respective subset of the switches through their control terminals.

Another one of the broader forms of the present disclosure involves a method for testing a semiconductor device. The method includes: providing a plurality of testing pads; providing a plurality of testing units; providing a plurality of controllable switching devices that are each coupled between a respective one of the testing pads and a respective one of the testing units; and selectively activating a subset of the switching devices that are all coupled between a selected one of the testing units and at least a subset of the testing pads, wherein the selectively activating establishes electrical coupling between the selected testing unit and the subset of the testing pads.

Yet another one of the broader forms of the present disclosure involves a method. The method includes: providing a testing unit and an electronic circuit coupled to the testing unit; applying a first electrical signal to the testing unit; sweeping a second electrical signal across a range of values, the second electrical signal supplying power to the electronic circuit, wherein the sweeping is performed while a value of the first electrical signal remains substantially the same; measuring a third electrical signal during the sweeping, the measured third electrical signal having a range of values that each correspond to one of the values of the second electrical signal; adopting a value of the second electrical signal that yields a minimum value of the third electrical signal as an optimum value of the second electrical signal; and testing the testing unit while the second electrical signal is set to the optimum value.

Another one of the broader forms of the present disclosure involves a semiconductor method. The method includes: providing a device under test (DUT), a plurality of testing pads, and electronic circuitry operable to establish or cut off electrical coupling between the DUT and at least a subset of the testing pads; resetting circuit components in the electronic circuitry; forcing a test voltage to a terminal of the DUT; applying a supply voltage to a power supply of the electronic circuitry while the test voltage is held at a constant value; detecting, in response to the applying, electrical noise generated by the electronic circuitry; repeating the applying and the detecting a plurality of times by adjusting an amount of the supply voltage for each repetition; identifying an amount of supply voltage that corresponds to a lowest amount of electrical noise as a target supply voltage; and thereafter testing the DUT using target supply voltage.

One more of the broader forms of the present disclosure involves an apparatus comprising a non-transitory, tangible computer readable storage medium storing a computer program. The computer program contains instructions that when executed, perform: resetting a plurality of circuit components in an electronic circuit; maintaining a fixed voltage at a terminal of a device under test (DUT); making a plurality of measurements with respect to electrical noise generated by the electronic circuit, wherein each measurement is made by applying a different power supply voltage to the electronic circuit; and determining, in response to the making the plurality of measurements, an optimum value of the power supply voltage that minimizes an amount of electrical noise.

Yet another one of the broader forms of the present disclosure involves a method. The method includes: providing a test unit and an electronic circuit that is electrically coupled to the test unit; performing a multi-dimensional sweeping process, wherein the multi-dimensional sweeping process includes sweeping a plurality of different electrical parameters across their respective ranges; monitoring a performance of the electronic circuit during the multi-dimensional sweeping process, wherein the monitoring includes identifying optimum values of the different electrical parameters that yield a satisfactory performance of the electronic circuit; and testing the test unit using the optimum values of the different electrical parameters.

Another one of the broader forms of the present disclosure involves a semiconductor testing method. The method includes: providing a device under test (DUT), a plurality of testing pads, and electronic circuitry operable to control electrical communication between the DUT and at least a subset of the testing pads; applying a first voltage to the DUT and a second voltage to the electronic circuitry; detecting, in response to the applying, electrical noise generated by the electronic circuitry; repeating the applying and the detecting a plurality of times by changing values of the first and second voltages during each repetition; identifying target values of the first and second voltages that correspond to a lowest amount of electrical noise; and testing the DUT using the target values of the first and second voltages. In some embodiments, the first voltage includes a device terminal voltage and the second voltage includes a power supply voltage.

In some embodiments, the repeating includes executing a nested loop that includes an inner loop and an outer loop, the inner loop being situated within the outer loop, the inner loop includes a sweep of the first voltage, and the outer loop includes a sweep of the second voltage. In some embodiments, the executing the nested loop yields the target value of the second voltage. In such embodiments, the repeating can further includes, after the nested loop is executed, performing an additional sweep of the first voltage that yields the target value of the first voltage, the additional sweep being performed while the second voltage is maintained at the target value. In some embodiments, the DUT includes at least one of a resistor and a transistor, the electronic circuitry includes a plurality of electronic switches and a plurality of memory storage elements, and the electrical noise includes leakage current of the electronic circuitry. In some embodiments, the method further includes executing one or more of the applying, the detecting, the repeating, the identifying, and the testing for a plurality of additional DUTs as a part of a parallel testing processes. In such embodiments, at least a subset of the testing pads may be shared between the DUT and the plurality of additional DUTs.

One more of the broader forms of the present disclosure involve an apparatus comprising a non-transitory, tangible computer readable storage medium storing a computer program. The computer program contains instructions that when executed, perform: performing a first sweeping process with respect to a first electrical parameter and a second electrical parameter, the sweeping process being performed on a testing unit and an electronic circuit communicatively coupled to the testing unit; determining a first optimum value of the first electrical parameter in response to the first sweeping process, the first optimum value being a value that yields a lower electrical noise than other values of the first electrical parameter; thereafter performing a second sweeping process with respect to the second electrical parameter, the second sweeping process being performed while the first electrical parameter is maintained at the first optimum value; determining a second optimum value of the second electrical parameter in response to the second sweeping process, the second optimum value being a value that yields a lower electrical noise than other values of the second electrical parameter; and testing the testing unit using the first and second optimum values for the first and second electrical parameters, respectively. In some embodiments, the first sweeping process is carried out using greater sweeping steps than the second sweeping process.

In some embodiments, the first electrical parameter includes a power supply voltage, the second electrical parameter includes a device terminal voltage, and the first sweeping process is executed using a nested loop, the device terminal voltage being a variable of an inner loop of the nested loop, and the power supply voltage being a variable of an outer loop of the nested loop. In some embodiments, the electronic circuit contains a plurality of electronic switching devices that are operable to selectively establish communication between the testing unit and a plurality of testing pads. In such embodiments, the instructions for performing the first sweeping process and the instructions for performing the second sweeping process each contain instructions for deactivating at least a subset of the electronic switching devices, and the instructions for testing the testing unit contain instructions for activating at least a subset of the electronic switching devices.

Yet another one of the broader forms of the present disclosure involves a method. The method includes providing a device-under-test electrically coupled to a testing apparatus; and determining an optimum value of a first electrical parameter and an optimum value of a second parameter by testing the device-under-test according to a set of first electrical parameter values and a set of second electrical parameter values. The optimum value of the first electrical parameter and the optimum value of the second parameter are determined based on an electrical noise response of the device-under-test. In some embodiments, the first parameter corresponds to a supply voltage and the second parameter corresponds to a device terminal voltage. In some embodiments, the optimum value of the first electrical parameter and the optimum value of the second parameter are determined using a first set of contacts of the device-under-test. In such embodiments, the method can further include testing the device-under test using a second set of contacts of the device-under-test according to at least one of the optimum value of the first electrical parameter or the optimum value of the second parameter. In some embodiments, the values of the set of first electrical parameter values are at a coarser interval than the values of the set of second electrical parameter values.

Yet another one of the broader forms of the present disclosure involves a method. The method includes electrically coupling a plurality of testing pads of a circuit to test unit and iteratively testing the circuit using the test unit according to a first parameter and a second parameter. The first parameter is tested at each of a first plurality of steps within a first range, and the second parameter is tested at each of a second plurality of steps within a second range.

The testing of the circuit is performed to determine a response at each combination of the first plurality of steps and the second plurality of steps by iteratively selecting one of the first plurality of steps and testing the circuit using each step of the second plurality of steps. In some embodiments, the first parameter corresponds to a first voltage and the second parameter corresponds to a second voltage. In some embodiments, the first parameter corresponds to a supply voltage and the second parameter corresponds to a device terminal voltage. In some embodiments, the first plurality of steps is at a coarser interval than the first plurality of steps. In some embodiments, the response includes a leakage current.

In some embodiments, the method further includes determining one of the first plurality of steps as an optimum value of the first parameter based on the corresponding determined response, and determining one of the second plurality of steps as an optimum value of the second parameter based on the corresponding determined response. In some embodiments, the testing of the circuit is performed using a first pad set of the plurality of testing pads. In such embodiments, the method can further include iteratively testing the circuit using a second pad set of the plurality of testing pads according to at least one of the optimum value of the first parameter or the optimum value of the second parameter.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   providing a device under test electrically coupled to a testing apparatus;
   applying a first voltage to the device under test and a second voltage to the testing apparatus;
   detecting, in response to the applying, electrical noise generated by the testing apparatus;
   repeating the applying and the detecting a plurality of times by changing values of the first voltage and the second voltage during each repetition;
   identifying a first optimum value of the first voltage and a second optimum value of the second voltage that correspond to a minimum amount of electrical noise; and
   testing the device under test using the first optimum value of the first voltage and the second optimum value of the second voltage.

2. The method of claim 1, wherein:
   the repeating includes executing a nested loop that includes an inner loop and an outer loop, the inner loop being situated within the outer loop;
   the inner loop includes a first sweep of the first voltage; and
   the outer loop includes a second sweep of the second voltage.

3. The method of claim 2, wherein:
   the executing the nested loop yields the second optimum value of the second voltage; and
   the repeating further includes, after the nested loop is executed, performing a third sweep of the first voltage that yields the first optimum value of the first voltage, the third sweep being performed while the second voltage is maintained at the second optimum value.

4. The method of claim 1, wherein:
   the first voltage is a device terminal voltage; and
   the second voltage is a power supply voltage.

5. The method of claim 1, wherein:
   the device under test includes at least one of: a resistor and a transistor;
   the testing apparatus includes a plurality of electronic switches and a plurality of memory storage elements; and
   the electrical noise includes leakage current of the testing apparatus.

6. The method of claim 1, wherein the providing the device under test electrically coupled to the testing apparatus includes selectively activating a subset of electronic switches to establish electrical coupling between the device under test and a subset of testing pads of the testing apparatus.

7. The method of claim 1, further including executing one or more of the applying, the detecting, the repeating, the identifying, and the testing for a plurality of additional device under tests as a part of parallel testing processes.

8. The method of claim 7, wherein the testing apparatus includes at least a subset of testing pads that are shared between the device under test and the plurality of additional device under tests.

9. A method comprising:
   electrically coupling a device-under-test to a testing apparatus;
   applying device terminal voltages to the device-under-test;
   applying power supply voltages to the testing apparatus;
   measuring an electrical noise response of the testing apparatus during the applying the device terminal voltages and the power supply voltages to determine an optimum device terminal voltage and an optimum power supply voltage that minimize the electrical noise response of the testing apparatus; and
   testing the device-under-test using the optimum device terminal voltage and the optimum power supply voltage.

10. The method of claim 9, wherein the electrical noise response corresponds with leakage current of the testing apparatus.

11. The method of claim 9, wherein:
    the applying the device terminal voltages to the device-under-test includes sweeping across a desired range of the device terminal voltages while a fixed power supply voltage is applied to the testing apparatus; and
    the applying the power supply voltages to the testing apparatus includes sweeping across a desired range of the power supply voltages while a fixed device terminal voltage is applied to the device-under-test.

12. The method of claim 11, wherein the sweeping across the desired range of the device terminal voltages is an inner loop of a nested loop sweeping process and the sweeping across the desired range of the power supply voltages is an outer loop of the nested loop sweeping process.

13. The method of claim 11, wherein the sweeping across the desired range of the device terminal voltages and the sweeping across the desired range of the power supply voltages use different step sizes.

14. The method of claim 11, wherein the sweeping across the desired range of the device terminal voltages is performed before the sweeping across the desired range of the power supply voltages.

15. The method of claim 9, wherein the device-under-test is one of a plurality of device-under-tests and electrically coupling the device-under-test to the testing apparatus includes selectively activating a subset of switching devices to electrically couple the one of the plurality of device-under-tests to a subset of testing pads of the testing apparatus.

16. The method of claim 15, wherein selectively activating the subset of switching devices to electrically couple the one of the plurality of device-under-tests to the subset of testing pads of the testing apparatus includes receiving signals from at least one flip flop device.

17. An apparatus comprising a non-transitory, tangible computer readable storage medium storing a computer program, wherein the computer program contains instructions that when executed, perform:
   performing a first sweeping process with respect to a first electrical parameter and a second electrical parameter, the first sweeping process being performed on a testing unit and an electronic circuit communicatively coupled to the testing unit;
   determining a first optimum value of the first electrical parameter in response to the first sweeping process, the first optimum value being a value that yields a lower electrical noise than other values of the first electrical parameter;
   thereafter, performing a second sweeping process with respect to the second electrical parameter, the second sweeping process being performed while the first electrical parameter is maintained at the first optimum value;
   determining a second optimum value of the second electrical parameter in response to the second sweeping process, the second optimum value being a value that yields a lower electrical noise than other values of the second electrical parameter; and
   testing the testing unit using the first optimum value and the second optimum value for the first electrical parameter and the second electrical parameter, respectively.

18. The apparatus of claim 17, wherein:
   the first electrical parameter includes a power supply voltage;
   the second electrical parameter includes a device terminal voltage; and
   the first sweeping process is executed using a nested loop, the device terminal voltage being a variable of an inner loop of the nested loop, and the power supply voltage being a variable of an outer loop of the nested loop.

19. The apparatus of claim 17, wherein:
   the electronic circuit contains a plurality of electronic switching devices that are operable to selectively establish communication between the testing unit and a plurality of testing pads;
   the instructions for performing the first sweeping process and the instructions for performing the second sweeping process each contain instructions for deactivating at least a subset of the electronic switching devices; and
   the instructions for testing the testing unit contain instructions for activating at least a subset of the electronic switching devices.

20. The apparatus of claim 17, wherein the first sweeping process is carried out using greater sweeping steps than the second sweeping process.

* * * * *